(12) United States Patent
Yoshida

(10) Patent No.: US 6,856,931 B2
(45) Date of Patent: Feb. 15, 2005

(54) MARK DETECTION METHOD AND UNIT, EXPOSURE METHOD AND APPARATUS, AND DEVICE MANUFACTURING METHOD AND DEVICE

(75) Inventor: Kouji Yoshida, Adachi-ku (JP)

(73) Assignee: Nikon Corporation, Tokyo (JP)

( * ) Notice: Subject to any disclaimer, the term of this patent is extended or adjusted under 35 U.S.C. 154(b) by 74 days.

(21) Appl. No.: 10/029,864

(22) Filed: Dec. 31, 2001

(65) Prior Publication Data

US 2002/0095234 A1 Jul. 18, 2002

Related U.S. Application Data

(63) Continuation of application No. PCT/JP00/04225, filed on Jun. 28, 2000.

(30) Foreign Application Priority Data

Jun. 29, 1999 (JP) .......................................... 11-182832

(51) Int. Cl.$^7$ ................................................ G01D 1/00
(52) U.S. Cl. .................... 702/127; 702/150; 356/237.4; 356/237.5; 356/508; 356/509; 356/401; 382/151
(58) Field of Search ................................ 702/127, 150; 356/237.4, 237.5, 508, 509, 401, 400; 382/151; 355/53, 55

(56) References Cited

U.S. PATENT DOCUMENTS

| | | | | |
|---|---|---|---|---|
| 4,955,062 A | * | 9/1990 | Terui ........................... | 382/144 |
| 5,214,489 A | * | 5/1993 | Mizutani et al. ............. | 356/490 |
| 5,493,403 A | * | 2/1996 | Nishi .......................... | 356/401 |
| 5,499,099 A | * | 3/1996 | Sato et al. ................... | 356/400 |
| 5,543,921 A | * | 8/1996 | Uzawa et al. ................ | 356/401 |
| 5,689,339 A | * | 11/1997 | Ota et al. .................... | 356/401 |
| 5,734,478 A | * | 3/1998 | Magome et al. ............. | 356/401 |
| 5,986,766 A | * | 11/1999 | Koga et al. .................. | 356/401 |
| 6,097,495 A | * | 8/2000 | Uzawa et al. ................ | 356/401 |
| 6,333,786 B1 | * | 12/2001 | Uzawa et al. ................ | 356/401 |
| 6,521,385 B2 | * | 2/2003 | Yoshida et al. ............... | 430/22 |
| 6,539,326 B1 | * | 3/2003 | Hirano ........................ | 702/150 |
| 6,549,648 B1 | * | 4/2003 | Rinn ........................... | 382/151 |

FOREIGN PATENT DOCUMENTS

| | | |
|---|---|---|
| EP | 0 573 299 A1 | 12/1993 |
| JP | 2-268372 | 11/1990 |
| JP | 11-45849 | 2/1999 |

* cited by examiner

*Primary Examiner*—John Barlow
*Assistant Examiner*—Anthony T. Dougherty
(74) *Attorney, Agent, or Firm*—Oblon, Spivak, McClelland, Maier & Neustadt, P.C.

(57) ABSTRACT

In view of a specific area having a characteristic surface state in a mark-formed area or a surrounding area thereof, an area calculation unit has a window having a dimension corresponding to the specific area scan the whole measurement area in order to obtain a quantity representing a surface state based on measured signals through the window, and then, by identifying a measured signal area corresponding to the specific area based on the quantity as a function of the window's position, extracts a measured signal area corresponding to the mark. And a position calculation unit performs computation such as pattern-matching on the signal area extracted, thereby detecting the position of the mark accurately and quickly.

56 Claims, 19 Drawing Sheets

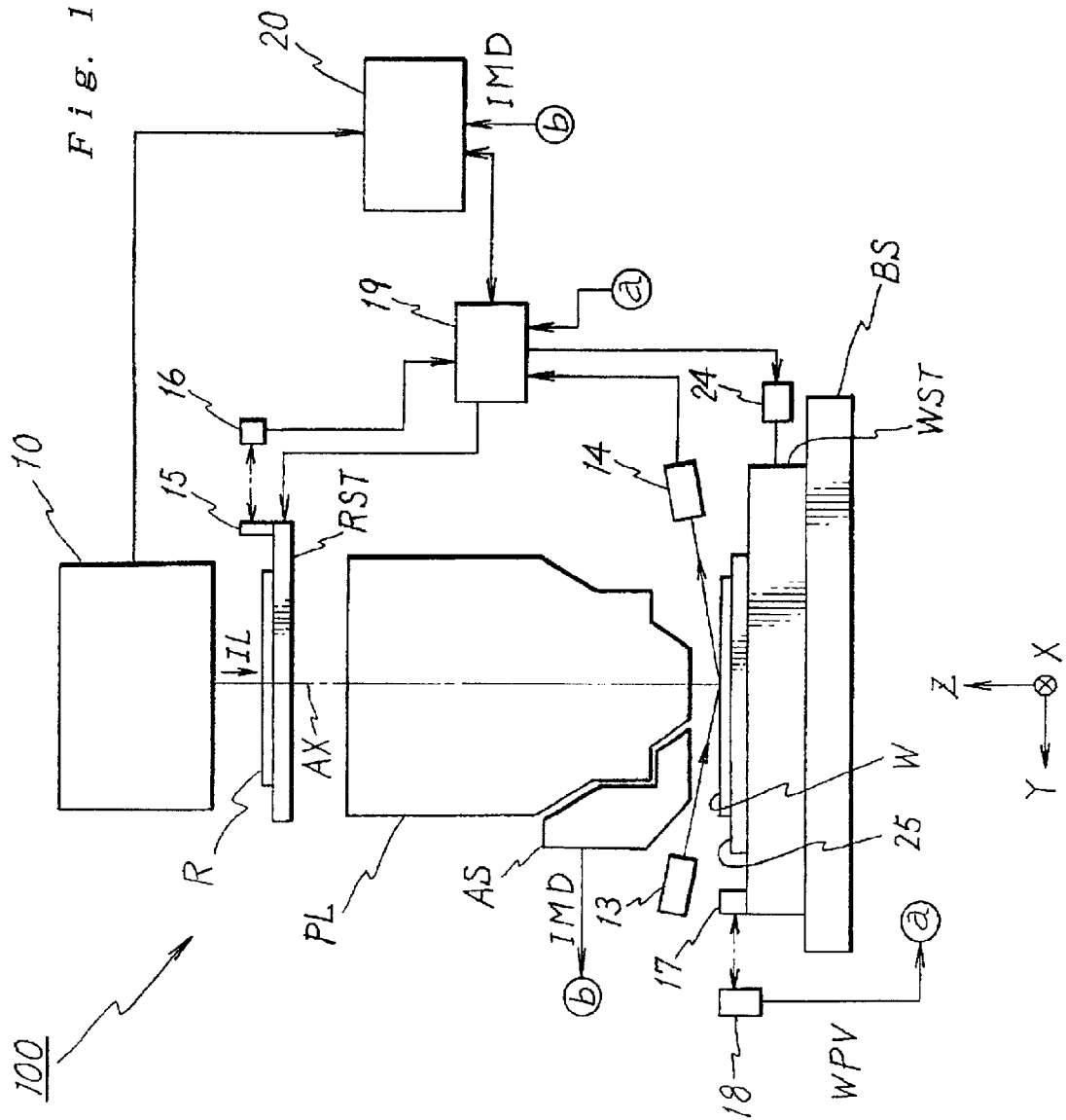

MARK DETECTION METHOD AND UNIT, EXPOSURE METHOD AND APPARATUS, AND DEVICE MANUFACTURING METHOD AND DEVICE

CROSS-REFERENCE TO RELATED APPLICATIONS

This is a continuation of International Application PCT/JP00/04225, with an international filing date of Jun. 28, 2000, the entire content of which being hereby incorporated herein by reference, which was not published in English.

BACKGROUND OF THE INVENTION

1. Field of the Invention

The present invention relates to a mark detection method and unit, an exposure method and apparatus, and a device manufacturing method and a device, and more specifically to a mark detection method and unit for detecting the positions of marks formed on an object, an exposure method using the mark detection method and an exposure apparatus comprising the mark detection unit, and a device manufacturing method using the exposure method and a device manufactured by using the exposure apparatus.

2. Description of The Related Art

In a lithography process for manufacturing semiconductor devices, liquid crystal display devices, or the like, exposure apparatuses have been used which transfer a pattern formed on a mask or reticle (generically referred to as a "reticle" hereinafter) onto a substrate, such as a wafer or glass plate (hereinafter, referred to as a "sensitive substrate" or "wafer" as needed), coated with a resist through a projection optical system. As such an exposure apparatus, a stationary-exposure-type projection exposure apparatus such as the so-called stepper, or a scanning-exposure-type projection exposure apparatus such as the so-called scanning stepper is mainly used.

In such an exposure apparatus, it is necessary to highly accurately align the reticle with the wafer before exposure. For the purpose of this alignment, a position detection mark (alignment mark) has been formed (transferred) on each shot area of the wafer in the previous photolithography process, and by detecting the position of this alignment mark, the position of the wafer (or a circuit pattern on the wafer) can be detected. And on the basis of the detection result of the position of the wafer (or a circuit pattern on the wafer), the alignment is performed.

Several methods of detecting the positions of alignment marks on a wafer are actually being used. However, in any of the methods, by analyzing the waveform of a detected signal of an alignment mark obtained by a detector for position detection, the position of the alignment mark on the wafer is detected. For example, in position detection through use of image detection that is mainly being used these days, the position of an alignment mark is detected by picking up an optical image of the alignment mark through use of a picking-up unit and analyzing the light intensity distribution of its picked-up signal, i.e. the image.

As such a method of analyzing a signal waveform, there is a pattern matching (template matching) method which examines correlation between the signal waveform and a beforehand-prepared template waveform by using the position of the alignment mark as a parameter. By analyzing the signal waveform through use of this pattern matching method and obtaining a value of the parameter at which the correlation between the signal waveform and the template waveform is highest, the position of the alignment mark is accurately detected.

In the prior art method of detecting the positions of alignment marks, the image of an alignment mark is picked up such that the image includes the characteristic of the alignment mark needed to detect the position of the alignment mark. Here, for example, the characteristic of an alignment mark needed to detect its position is the state of arrangement of lines when an X-position detection alignment mark comprises lines and spaces which are alternately arranged in an X-direction and extend in a Y-direction, the alignment mark being called a line-and-space mark. Therefore, while the image-pick-up area for the line-and-space mark for X-position detection may be smaller in a dimension in the Y-direction than the line-and-space mark, the image-pick-up area needs to be remarkably larger in a dimension in the X-direction than the line-and-space mark depending on the accuracy in determining the pick-up position in earlier measurement. That is, the pick-up result of the line-and-space mark for X-position detection covers the broad area including the line-and-space mark in the X-direction.

Meanwhile, because it is unknown beforehand where in the X-direction the line-and-space mark for X-position detection is located in the image-pick-up area, pattern-matching is performed over the whole dimension in the X-direction of the image-pick-up area. Therefore, the computation of the pattern-matching becomes enormous in amount and takes a long time, and the prior art has a possibility of mistaking the signal pattern of an area outside the mark-formed area of the X-position detection mark as the signal pattern of the X-position detection mark.

These are true with the line-and-space mark for Y-position detection and other types of position detection marks as well as the line-and-space mark for X-position detection, in the prior art.

This invention was made under such circumstances, and a first purpose of the present invention is to provide a mark detection method and unit that can quickly and accurately detect the positions of marks formed on an object.

Furthermore, a second purpose of the present invention is to provide an exposure apparatus that can improve exposure accuracy in transferring a given pattern onto a substrate and throughput by detecting quickly and accurately the positions of marks formed on the substrate.

Moreover, a third purpose of the present invention is to provide devices on which a fine pattern is accurately formed and a device manufacturing method with which to manufacture such devices with high productivity.

SUMMARY OF THE INVENTION

According to a first aspect of the present invention, there is provided a mark detection method with which to detect a mark formed on an object, comprising the steps of measuring a surface state of an area of said object including said mark in a predetermined direction; and extracting an area having a measurement result reflecting said mark based on measurement results obtained in said step of measuring.

According to this, after measuring an area having a mark therein of an object in a predetermined direction, an area having a measurement result reflecting the mark is extracted. As a result, where the mark is located in the measurement-area and thus an area having a measurement result reflecting the mark can be accurately and quickly detected, the area being called a "mark-signal area" hereinafter. By performing a signal process only on the mark-signal area extracted, it can be prevented to mistake the signal pattern of an area outside a mark-formed area as the signal pattern of the position detection mark, thereby quickly detecting the position of the mark.

The mark detection method of this invention is also applied to the case where there is a no-mark area on the outside in said predetermined direction of a mark-formed area where said mark is formed, said no-mark area having a characteristic compared to other areas. One example of the no-mark area is a pattern-prohibited band for distinguishing a mark pattern from other patterns, which band is provided around the mark and has a characteristic surface having a predetermined width and having no pattern thereon.

In such a case, said step of extracting runs a window having a dimension corresponding to said no-mark area, obtains at least one quantity denoting the surface state of an area in said window moving across said no-mark area having a characteristic based on measurement results through said window, and extracts an area having a measurement result reflecting said mark based on said at least one quantity varying with position of said window. For example, in the case of applying this to the pattern-prohibited band, by, while running a window having a dimension corresponding to the width in a predetermined direction of the pattern-prohibited band, obtaining a position of the window where the measurement result through the window reflects the characteristic of the pattern-prohibited band best, a mark-signal area can be extracted from the measurement area.

Here, said no-mark area may consist of two areas on both sides of said mark-formed area along said predetermined direction. For example, in the case where pattern-prohibited bands for distinguishing a mark pattern from other patterns are provided next to the mark, two signal areas reflecting the pattern-prohibited bands and having a certain width appears on both sides of the mark-signal area in the measurement area, in which case there are two signal areas which have a characteristic reflecting the pattern-prohibited band, have a certain width, and are a distance apart from each other in a predetermined direction. Therefore, by, while running in the predetermined direction two windows which are the distance apart from each other in the predetermined direction and have a given width, obtaining a position of the window where the measurement result through the window reflects the characteristic of the pattern-prohibited band best, the mark-signal area can be extracted from the measurement area.

Moreover, the mark detection method of this invention is also applied to the case where there is a mark area on the inside in said predetermined direction of a mark-formed area where said mark is formed, said mark area having a characteristic compared to other areas. One example of the mark area is a mark-formed area over the whole of which the state of the surface greatly varies along the predetermined direction.

In such a case, said step of extracting runs a window having a dimension corresponding to said mark area, obtains at least one quantity denoting the surface state of an area in said window moving across said mark area having a characteristic based on measurement results through said window, and extracts an area having a measurement result reflecting said mark based on said at least one quantity varying with position of said window. For example, in the case of applying this to the mark-formed area where the state of the surface greatly varies along the predetermined direction, by, while running a window having a dimension corresponding to the width in a predetermined direction of the mark-signal area, obtaining a position of the window where the variance of the measurement values through the window takes on a local maximum (or maximum), the mark-signal area can be extracted from the measurement area.

In the position detection method of this invention, said at least one quantity may include at least one of average and variance of values in a measurement result through said window. For example, when a pattern-prohibited band is present, the signal values are substantially the same in a signal area corresponding to the pattern-prohibited band. In this case, if the average of the signal values in the signal area corresponding to the pattern-prohibited band is larger or smaller than those of the other areas, the signal area corresponding to the pattern-prohibited band and thus the mark-formed area can be extracted by using the averages of measured values through the window. Furthermore, because the signal values are substantially the same in the signal area corresponding to the pattern-prohibited band, the variance of measured values through the window becomes smaller as the window covers more of the pattern-prohibited band. Therefore, the signal area corresponding to the pattern-prohibited band and thus the mark-formed area can be extracted by using the variances of measured values through the window.

Furthermore, if the signal value greatly varies in a signal area corresponding to a mark-formed area along the predetermined direction, when the window covers only the mark-signal area, the variance of measured values through the window becomes largest. Therefore, the mark-signal area can be extracted by using the variances of measured values through the window.

At least one of the average and variance of values in a measurement result through the window may be at least one of the average and variance of values measured along a scan line and through the window, or may be at least one of the average and variance of integrated values in each of which values in a measurement result through the window are integrated which values are on a respective line perpendicular to the predetermined direction, i.e. are on different scan lines. In this case, because high-frequency noise can be reduced by the integrating of values compared to the case of one scan line, the area can be accurately extracted.

The mark detection method according to this invention may further comprise the step of detecting a position of said mark in said predetermined direction based on the measurement result of said area extracted in said step of extracting. In this case, because a signal process for accurately detecting the position such as pattern matching is performed only on the mark-signal area extracted in the step of extracting, the position of the mark can be detected highly accurately and quickly.

In addition, in the mark detection method according to this invention, where the at least one quantity includes at least one of average and variance of measured values through the window, said step of detecting may detect a position of said mark in said predetermined direction based on at least one of said average and said variance after removing noise from said measurement result extracted. In this case, based on the average and variance of measured signal values through the window including noise components such as measurement errors in the step of measuring and errors relative to design values the noise components can be removed from the measurement result. Therefore, the mark position can be highly accurately detected.

In the mark detection method of this invention, said surface state includes a state of light from a surface of said object. That is, said surface state includes not only the irregularity of the surface but also the distribution of reflectance on the surface, the irregularity inside the transmissive layer and the distribution of reflectance therein, and those of the mark, if the mark is transmissive.

Moreover, in the mark detection method according to this invention, said step of measuring may measure a state of a surface of said object, which surface has a plurality of dimensions, and said step of extracting may extract an area having said plurality of dimensions and a measurement result reflecting said mark based on measurement results obtained in said step of measuring. In this case, by analyzing the measurement result reflecting the mark in an area having a plurality of dimensions (e.g. two dimensions) the position in the plurality of dimensions of the mark can be obtained.

According to a second aspect of the present invention, there is provided a mark detection unit which detects a mark formed on an object, comprising a measuring unit which measures a surface state of an area of said object including said mark in a predetermined direction; and an extracting/computing unit which extracts an area having a measurement result reflecting said mark based on measurement results obtained by said measuring unit.

According to this, a measuring unit measures a surface state of an area of the object including the mark in a predetermined direction, and an extracting/computing unit extracts an area having a measurement result reflecting the mark based on measurement results obtained by the measuring unit. Therefore, the mark-formed area can be extracted accurately and quickly because of detecting the mark by using the mark detection method of this invention.

The mark detection unit according to this invention may further comprise a position-computing unit which obtains a position of said mark in said predetermined direction based on the measurement result of said area extracted by said extracting/computing unit. In this case, because a position-computing unit performs the computing of a position of the mark in the predetermined direction only on the mark-signal area extracted by the extracting/computing unit, the position of the mark can be detected highly accurately and quickly.

Furthermore, in the mark detection unit according to this invention, said measuring unit may comprise an image-pick-up unit which picks up a mark formed on said object, and said measurement result may be light intensities of a mark image picked up by said image-pick-up unit.

Moreover, in the mark detection unit according to this invention, said extracting/computing unit runs a window having a dimension corresponding to a specific area whose surface state has a different characteristic from other areas on an object, obtains at least one quantity denoting the surface state of an area in said window moving across said specific area having a characteristic based on measurement results through said window, and extracts an area having a measurement result reflecting said mark based on said at least one quantity varying with position of said window. In this case, the extracting/computing unit, while running a window having a given dimension, calculates at least one quantity in the window and obtains the distribution of values corresponding to the varying position of the window of the at least one quantity. And the mark-signal area is extracted by obtaining the position of the window at which the at least one quantity takes on a maximum or minimum. Therefore, the mark-signal area and thus the position of the mark can be extracted accurately and quickly.

Furthermore, in the mark detection unit according to this invention, said surface state includes a state of light from a surface of said object.

According to a third aspect of the present invention, there is provided an exposure method with which to transfer a predetermined pattern onto a plurality of divided areas on a substrate as an object, comprising the steps of detecting a second number of alignment marks out of a first number of alignment marks, which are formed on said substrate and have substantially the same shape, by a mark detection method according to this invention to obtain positions on said substrate of said second number of alignment marks and obtaining positions on said substrate of said divided areas; and transferring said pattern onto said divided areas with aligning said substrate based on positions on said substrate of said divided areas obtained in said step of detecting.

According to this exposure method, after extracting signal areas corresponding to a second number of alignment marks formed on the substrate by using a mark detection method according to this invention, the positions of the marks are detected highly accurately and quickly. And because transferring the pattern onto the divided areas while aligning the substrate based on the detection results, the pattern can be accurately and quickly transferred onto the divided areas.

There is provided an exposure method according to the exposure method of this invention, wherein said plurality of divided areas are arranged in a matrix arrangement on said substrate, wherein said alignment marks include a third number of first alignment marks having substantially the same shape, which are used for alignment with respect to a row-direction of said matrix and a fourth number of second alignment marks having substantially the same shape, which are used for alignment with respect to a column-direction of said matrix, and wherein said step of detecting obtains positions on said substrate and in said row-direction of a fifth number of first alignment marks out of said third number of first alignment marks by said mark detection method and obtains positions on said substrate and in said column-direction of a sixth number of second alignment marks out of said fourth number of second alignment marks by said mark detection method, and then obtains positions on said substrate of said divided areas by performing a statistical process on positions in said row-direction of said fifth number of first alignment marks and positions in said column-direction of said sixth number of second alignment marks. In this case, the positions in two dimensions of the divided areas on the substrate can be detected highly accurately and quickly, and because transferring the pattern onto the divided areas while highly accurately aligning the substrate based on the detection results, the pattern can be accurately and quickly transferred onto any of the divided areas arranged in a matrix arrangement.

According to a fourth aspect of the present invention, there is provided an exposure apparatus which transfers a predetermined pattern onto divided areas on a substrate, comprising a stage unit which moves said substrate along a movement plane; and a mark detection unit according to this invention, which detects alignment marks formed in said divided areas on said substrate mounted on said stage unit.

According to this exposure apparatus, because, after the mark detection unit according to this invention has extracted signal areas corresponding to alignment marks to detect the alignment marks, the positions of the alignment marks can be detected accurately and quickly, the predetermined pattern can be transferred onto the divided areas with improved accuracy and throughput.

Moreover, in a lithography process, fine patterns made of a plurality of layers can be formed on a substrate with high overlay-accuracy and throughput by exposure through use of the exposure apparatus according to this invention. Accordingly, highly integrated micro-devices can be manufactured with high yield and improved productivity. Therefore, according to another aspect of the present invention, there are provided a device manufactured using the exposure apparatus of this invention and a device manufacturing method using the exposure method of this invention.

BRIEF DESCRIPTION OF THE DRAWINGS

FIG. 1 is a schematic view showing the construction and arrangement of an exposure apparatus according to an embodiment;

DETAILED DESCRIPTION OF THE PREFERRED EMBODIMENTS

Figure 2A:
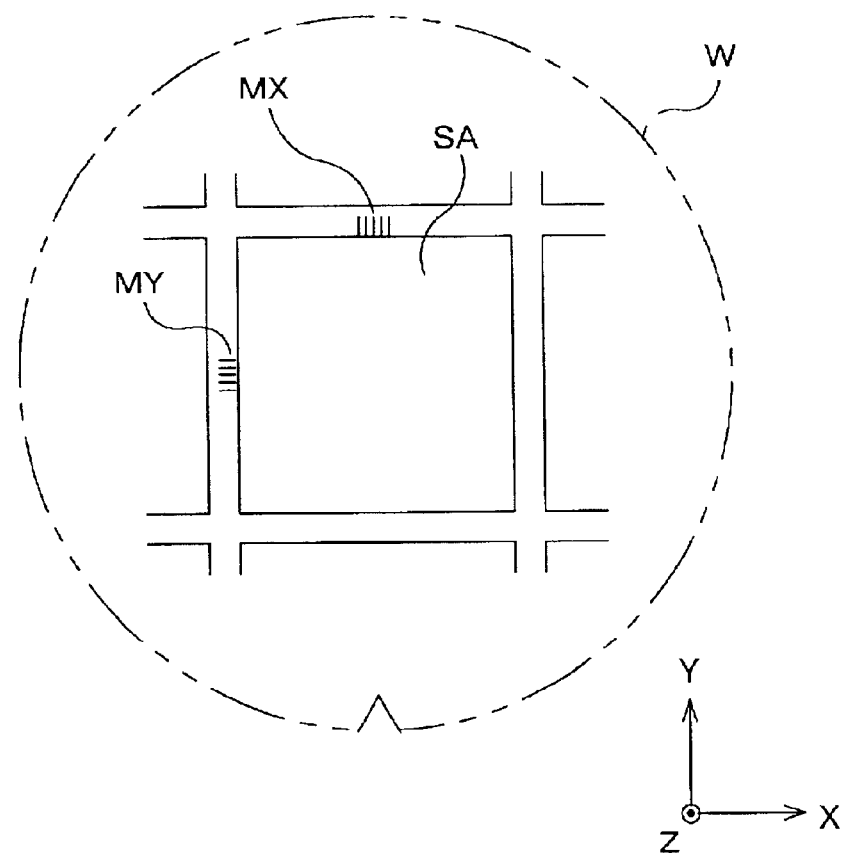
FIGS. 2A and 2B are views for explaining an exemplary alignment mark.

An embodiment of the present invention will be described below with reference to FIGS. 1 to 9.

FIG. 1 shows the schematic arrangement of an exposure apparatus 100 according to this embodiment, which is a projection exposure apparatus of a step-and-scan type. This exposure apparatus 100 comprises an illumination system 10, a reticle stage RST for holding a reticle R as a mask, a projection optical system PL, a wafer stage WST on which a wafer W as a substrate (an object) is mounted, an alignment microscope AS serving as an image-pick-up unit, a main control system 20 to control the whole apparatus overall and the like.

The illumination system 10 comprises a light source, an illuminance-uniformalizing optical system including a fly-eye lens and the like, a relay lens, a variable ND filter, a reticle blind, a dichroic mirror, and the like (none are shown). The construction of such an illumination system is disclosed in, for example, Japanese Patent Laid-Open No. 10-112433. As a light source unit, KrF excimer laser (a wavelength of 248 nm), ArF excimer laser (a wavelength of 193 nm), $F_2$ laser (a wavelength of 157 nm), $Kr_2$ laser (krypton dimmer; a wavelength of 146 nm), $Ar_2$ laser (argon dimmer; a wavelength of 126 nm), a harmonic wave generator using a copper vapor laser or YAG laser, an ultra-high pressure mercury lamp (g-line, i-line, etc.), or the like is used. Note that instead of light emitted from the above light source, X-ray or a charged particle beam such as an electron beam may be used. The illumination system 10 illuminates a slit-shaped illumination area defined by the reticle blind BL on the reticle R having a circuit pattern thereon with exposure light IL having almost uniform illuminance.

On the reticle stage RST, a reticle R is fixed by, e.g., vacuum chuck. The retilce stage RST can be finely driven on an X-Y plane perpendicular to the optical axis (coinciding with the optical axis AX of a projection optical system PL) of the illumination system 10 by a reticle-stage-driving portion (not shown) constituted by a magnetic-levitation-type, two-dimensional linear actuator in order to position the reticle R, and can be driven at specified scanning speed in a predetermined scanning direction (hereinafter, parallel to a Y-direction). Furthermore, in the present embodiment, because the magnetic-levitation-type, two-dimensional linear actuator comprises a Z-driving coil as well as a X-driving coil and a Y-driving coil, the reticle stage RST can be driven in a Z-direction.

The position of the reticle stage RST in the plane where the stage moves is always detected through a movable mirror 15 by a reticle laser interferometer 16 (hereinafter, referred to as a "reticle interferometer") with resolving power of, e.g., 0.5 to 1 nm. The positional information of the reticle stage RST is sent from the reticle interferometer 16 to a stage control system 19, and the stage control system 19 drives the reticle stage RST via the reticle-stage-driving portion (not shown) based on the positional information of the reticle stage RST.

The projection optical system PL is arranged underneath the reticle stage RST in FIG. 1, whose optical axis AX is parallel to be the Z-axis direction. Because a refraction optical system that is telecentric bilaterally and has a predetermined reduction ratio, e.g. ⅕ or ¼, is employed as the projection optical system PL, when the illumination area of the reticle R is illuminated with the exposure illumination light IL from the illumination optical system, the reduced image (partially inverted image) of the circuit pattern's part in the illumination area on the reticle R is formed on a wafer W coated with a resist (photosensitive material) via the projection optical system PL by the illumination light IL having passed the reticle R.

The wafer stage WST is arranged on a base BS below the projection optical system in FIG. 1, and on the wafer stage WST a wafer holder 25 is disposed on which a wafer W is fixed by, e.g., vacuum chuck. The wafer holder 25 is constructed to be able to be tilted in any direction with respect to a plane perpendicular to the optical axis of the projection optical system PL and to be able to be finely moved in the direction of the optical axis AX (the Z-direction) of the projection optical system PL by a driving portion (not shown). The wafer holder 25 can also rotate finely about the optical axis AX.

The wafer stage WST is constructed to be able to move not only in the scanning direction (the Y-direction) but also in a direction perpendicular to the scanning direction (the X-direction) so that a plurality of shot areas on the wafer can be positioned at an exposure area conjugated to the illumination area, and a step-and-scan operation is performed in which the operation of performing scanning-exposure of a shot area on the wafer and the operation of moving a next shot area to the exposure starting position are repeated. The wafer stage WST is driven in XY-two-dimensional directions by a wafer-stage driving portion 24 comprising a motor, etc.

The position of the wafer stage WST in the X-Y plane is always detected through a movable mirror 17 by a wafer laser interferometer with resolving power of, e.g., 0.5 to 1 nm. The positional information (or velocity information) WPV of the wafer stage WST is sent to the stage control system 19, and based on the positional information (or velocity information) WPV, the stage control system 19 controls the wafer stage WST.

The alignment microscope AS is an alignment sensor of an off-axis type provided on the side face of the projection optical system PL. The alignment microscope AS outputs the picked-up result of an alignment mark (wafer mark) provided on each shot area on the wafer.

As the alignment mark, for example, mark MX for detecting the X-direction position and mark MY for detecting the Y-direction position that are formed on street lines around the shot-area SA on the wafer as shown in FIG. 2A are used, these marks being used for positioning. As the marks MX and MY, a line-and-space mark having a periodic structure in a direction for detection and having a width of LMX (or LMY for the mark MY) in the direction for detection, as shown representatively by a magnified plan view of the mark MX in FIG. 2B, can be used. It is noted that while the line-and-space mark shown in FIG. 2B has five lines, not being limited to this, the number of lines that compose the mark MX or MY may be other than five. Furthermore, hereinafter, MX(i,j) and MY(i,j) represent an individual mark MX and an individual mark MY respectively, which correspond to a shot area SA, whose location on the wafer is indicated by (i,j).

Figure 3A:
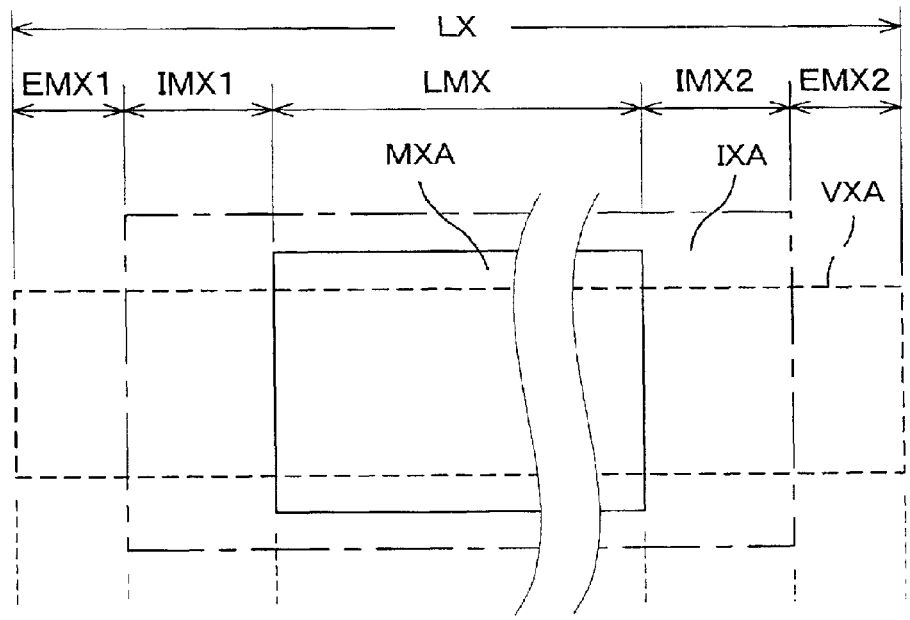
FIGS. 3A to 3C are views for explaining a result of picking up the image of the alignment mark in FIG. 2B.

The mark MX is formed within a mark-formed area MXA as shown in FIG. 3A, and around it a pattern-prohibited area IXA is present by which the mark MX can be distinguished from the other patterns. As shown in FIG. 3A, the pattern-prohibited area IXA contains an area having a width of IMX1 in the X-direction and located on the left side of the mark-formed area MXA in the figure and another area having a width of IMX2 in the X-direction and located on the right side of the mark-formed area MXA in the figure, the widths IMX1, IMX2 being determined upon designing the marks and being sufficiently larger than the widths of the lines and spaces of the mark X.

And the alignment microscope AS observes a sight area VXA covering the mark-formed area MXA and the pattern-prohibited area IXA in the X-direction and having a width of LX. In FIG. 3A, EMX1 denotes the width of an area of the sight area VXA outside the pattern-prohibited area IXA in the left end of the figure, and EMX2 denotes the width of an area of the sight area VXA outside the pattern-prohibited area IXA in the right end of the figure. It is noted that each time the mark MX is observed, the widths EMX1 and EMX2 vary and are to be measured.

It is noted that although in FIG. 3A the entire width of the sight area VXA in the Y-direction is present within the width of the mark-formed area MXA in the Y-direction, at least the center of the width of the sight area VXA in the Y-direction needs to be present within the width of the mark-formed area MXA in the Y-direction.

Figure 3B:
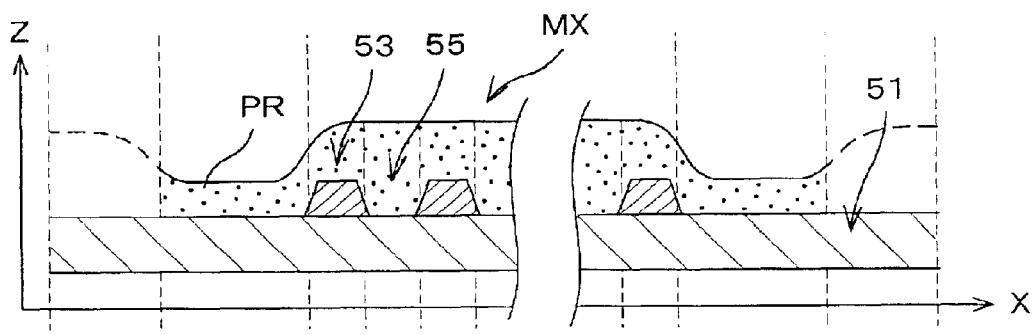

In this embodiment, as shown in a cross-sectional view along the X-Z plane of the mark MX in FIG. 3B, the mark MX, MY is composed of line portions 53 on a substrate 51, which are formed by raised portions separated by space portions 55 in the X-direction, and on the line portions 53 and space portions 55, a resist layer PR is formed, which is made of, e.g., a chemically amplified resist and which has a high transparency to light.

Furthermore, in the pattern-prohibited area IXA the resist layer PR covers the surface of the substrate 51 as in the space portions 55, and the sections on both sides of the pattern-prohibited area IXA are as shown in FIG. 3B.

The cross section along the X-Z plane of the line 53 is not rectangular but trapezoidal as shown in FIG. 3B. Moreover, because the resist layer PR has been coated by spin-coating, the surface of the resist layer PR in the mark-formed area MXA is raised from the surface of the resist layer PR in the pattern-prohibited area IXA, and the cross-section of the resist layer PR has a shape of a trapezoid.

Figure 3C:
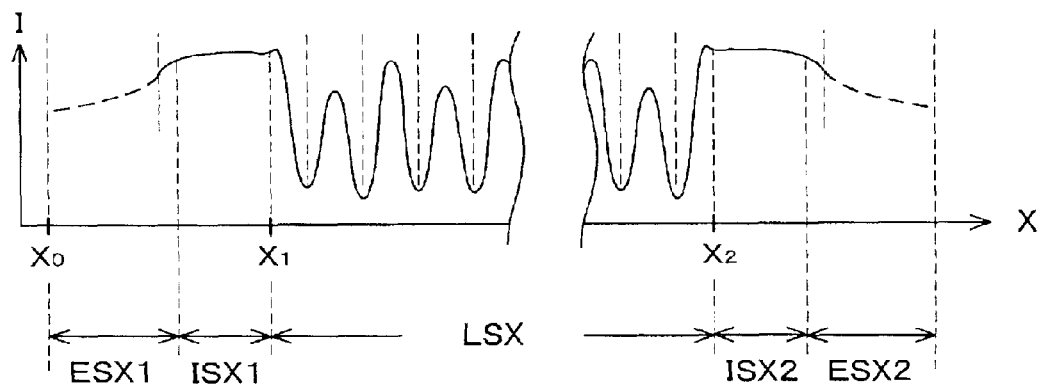

When picking up an image, in the sight area VXA, of the mark X having such structure, the distribution of the light intensities measured in the X-direction as shown in FIG. 3C is obtained. That is, in the mark-formed area MXA, the signal intensity 'I' takes on local minimums at the boundaries between the mark portions 53 and the space portions 55 and local maximums at the centers of the mark portions 53 and the space portions 55. Furthermore, at the boundaries between the mark-formed area MXA and the pattern-prohibited area IXA the signal intensity 'I' takes on local minimums because of the edges of line portions 55, and as the X-position goes outward from the boundary between the mark-formed area MXA and the pattern-prohibited area IXA, the signal intensity 'I' increases and, in the pattern-prohibited area IXA, takes on a substantially constant value (almost maximum). And around the outer edge of the pattern-prohibited area IXA, the signal intensity 'I' begins to decrease if a raised portion is present outside the pattern-prohibited area IXA.

That is, because there is no pattern in the pattern-prohibited area IXA, the signal intensity 'I' is ideally constant over the pattern-prohibited area IXA. However, because of the presence of lines outside the pattern-prohibited area IXA and the like, the widths ISX1, ISX2, over which the signal intensity 'I' is constant due to the absence of lines, are narrower than the widths IMX1, IMX2, which are widths planned in design. It is noted that although information related to the differences between the widths IMX1, IMX2 and the widths ISX1, ISX2 is affected by the process of forming marks MX, the process of forming the resist layer PR and whether or not lines are present outside the pattern-prohibited area IXA, the information is assumed to be obtained beforehand as design information or by earlier measurement. That is, it is assumed that the width LSX in the X-direction of a signal area (hereinafter, called a "mark-signal area") which reflects the surface state of the mark-formed area MXA and the widths ISX1, ISX2 in the X-direction of signal areas (hereinafter, called "prohibited-band signal areas") which reflect the surface state of the pattern-prohibited area IXA are already obtained.

Therefore, unknown variables when measuring a mark-signal area in the sight area VXA are widths ESX1 and ESX2 in FIG. 3C.

The mark MY also has the same pattern-prohibited area as the mark MX has, which is observed likewise.

The alignment microscope AS sends pick-up data IMD obtained by picking up the image of the sight area VXA to the main control system 20 (refer to FIG. 1).

It is remarked that recently as the feature sizes of semiconductor circuits become smaller, a flattening process for flattening the surfaces of layers formed on a wafer W has been being adopted in order to accurately form a finer circuit pattern. Such a flattening process is represented by CMP (Chemical & Mechanical Polishing) process which makes the surface of a formed membrane substantially flat by polishing. Such CMP process is often applied to insulating layers (dielectric layers made of, e.g., silicon dioxide) between metal layers of semiconductor circuits.

Moreover, recently STI (Shallow Trench Isolation) process that makes trenches having a predetermined width for insulating, e.g., adjacent device elements from each other and fills them with a dielectric layer has been developed. In the STI process, after having flattened the surface of the dielectric layer, which has irregularity due to the trenches, by CMP process, a poly-silicon layer is formed thereon. The exemplary process of forming the mark MX and another pattern using the above processes will be described in the below with reference to FIGS. 4A to 4E.

Figure 4A:
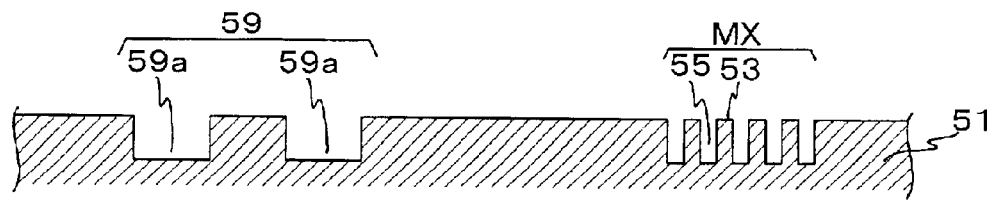
FIGS. 4A to 4E are views for explaining the process of forming the alignment mark in FIG. 2B, which process includes CMP process.

As shown by the cross-sectional view of FIG. 4A, the mark MX (specifically concaves corresponding to space portions 55) and a circuit pattern 59 (specifically concaves 59a) are formed on a silicon wafer (substrate) 51.

Figure 4B:
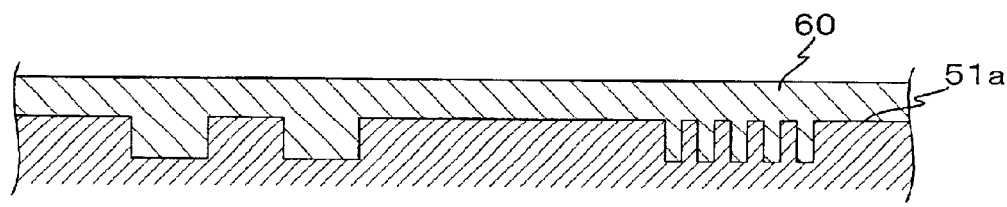
Figure 4C:
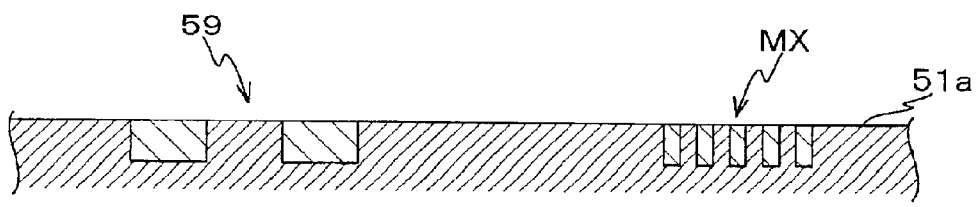

Next, as shown in FIG. 4B, an insulating layer 60 made of a dielectric, e.g. silicon dioxide, is formed on the surface 51a of the wafer 51. Subsequently, by applying CMP process to the insulating layer 60 the insulating layer 60 is polished and removed so that the surface 51a of the wafer 51 can expose itself. As a result, in the area corresponding to the circuit pattern 59 the concaves 59a filled with the insulating material 60 are formed, and in the area for the mark MX, the concaves corresponding to the space portions 55 and filled with the insulating material 60 are formed.

Figure 4D:
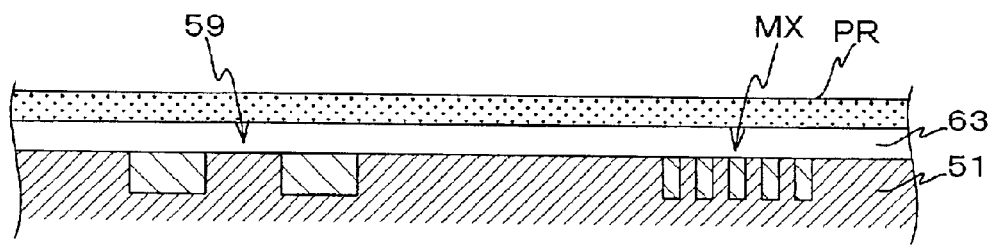

Next, as shown in FIG. 4D, a poly-silicon layer 63 is formed on the surface 51a of the wafer 51, and the poly-silicon layer 63 is coated with the photo-resist PR.

When observing the mark MX on the wafer 51 as shown in FIG. 4D by the alignment microscope AS, there is no irregularity reflecting the structure of the mark MX under the poly-silicon layer 63 on the surface of the poly-silicon layer 63. Furthermore, the poly-silicon layer 63 does not transmit light beams having a wavelength in a range of, e.g., 550 nm to 780 nm (visible light). Therefore, if, upon alignment, visible light is employed as light for detecting alignment marks, the marks MX cannot be detected, or the accuracy of detection is very likely to greatly decrease due to the decrease in the amount of light detected.

Moreover, in FIG. 4D in place of the poly-silicon layer 63 a metal layer may be formed, in which case there is no irregularity reflecting the structure of an alignment mark under the metal layer 63 on the surface of the metal layer 63. Furthermore, because light for detecting alignment marks cannot usually pass through metal layers, the marks MX are very likely not to be detected.

Accordingly, when observing the wafer 51 having the poly-silicon layer 63 formed thereon through the CMP process in FIG. 4D by using the alignment microscope AS, switching the alignment-marks-detection light to light having a wavelength other than those of visible light such as infrared light (a wavelength of 800 to 1500 nm) is needed in order to observe the marks MX if switching of wavelengths through selection or setting is possible.

Figure 4E:
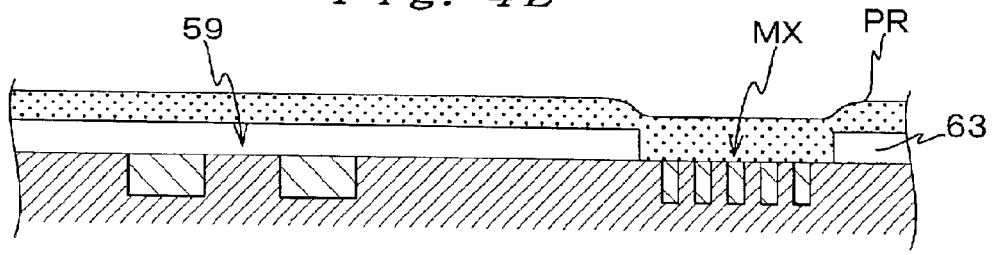

If switching of wavelengths is not possible, or the metal layer 63 is formed on the wafer 51 through CMP process, as shown in FIG. 4E, part of the poly-silicon layer 63 or the metal layer 63 on the area of the mark MX needs to be removed through photo-lithography in order to observe the marks MX.

The mark MY is also formed in the same way as the mark MX.

Figure 5:
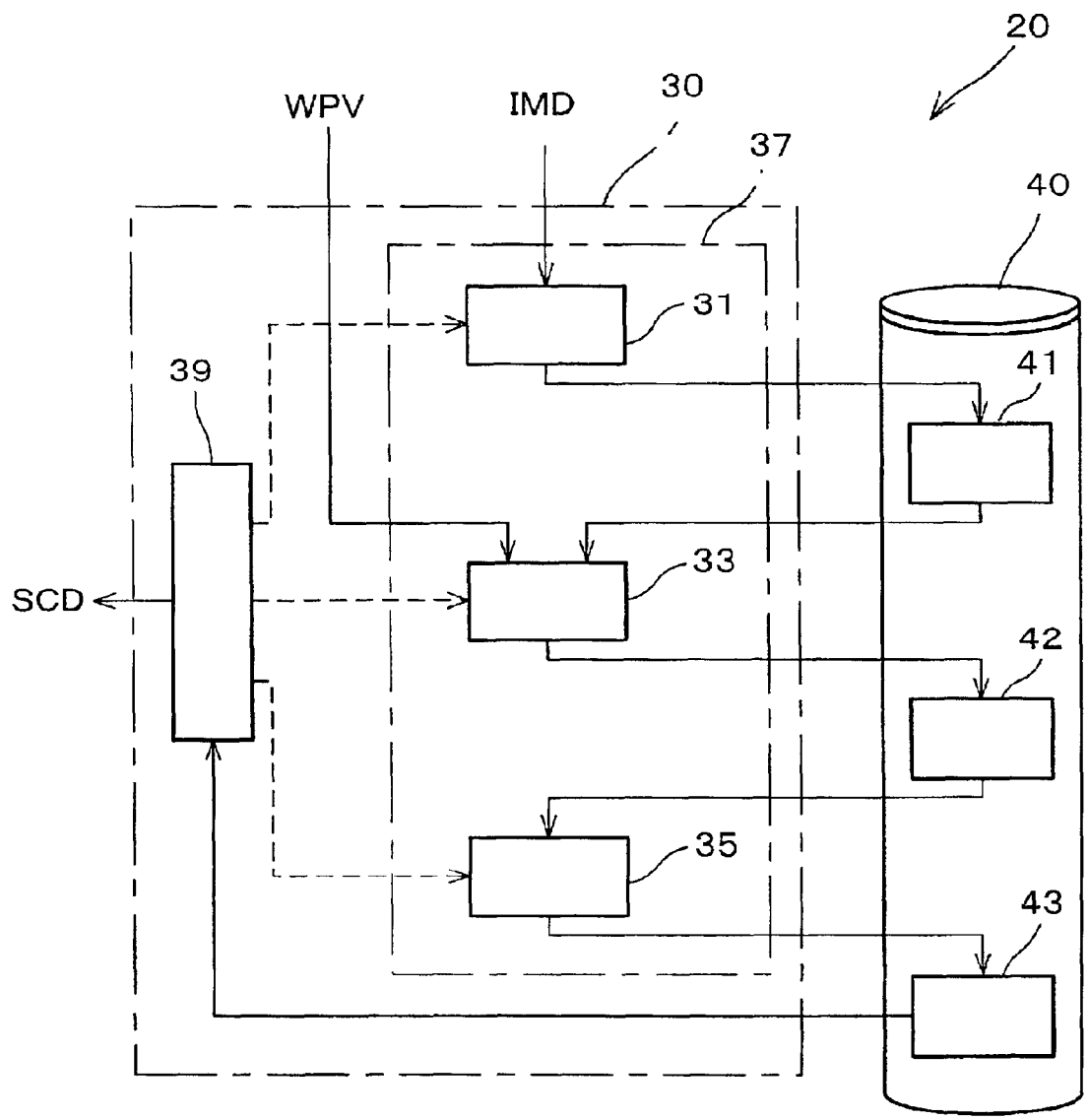
FIG. 5 is a schematic view showing the construction and arrangement of a main control system.

The main control system 20, as shown in FIG. 5, comprises a main controller 30 and a storage unit 40, and the main controller 30 comprises a controller 39 that controls the operations of the exposure apparatus 100 by, e.g., sending stage control data SCD to the stage control system 19 and a mark detection unit 37. The mark detection unit 37 comprises a picked-up data collection unit 31, an area calculation unit 33 as a first computing unit for extracting the areas, where the alignment marks MX, MY are formed, based on picked-up data collected by the picked-up data collection unit 31, and a position calculation unit 35 as a second computing unit for calculating positions of the alignment marks MX, MY based on information calculated by the area calculation unit 33 concerning the areas where the alignment marks MX, MY are formed. Further, the storage unit 40 comprises a picked-up data storing area 41, an area-information storing area 42 and a position-information storing area 43, and the alignment microscope AS and the picked-up data collection unit 31 compose a measuring unit. It is noted that in FIG. 5 data-flows are denoted by solid arrows and control-flows are denoted by dashed arrows. The operations of the units of the main control system 20 will be described later.

Although, in this embodiment, the main controller 30 comprises various units as describe above, the main controller 30 may be a computer system which executes computer programs built therein for performing functions of the various units.

Referring back to FIG. 1, in the exposure apparatus 100, a multi-focal detection system of an oblique-incidence type is fixed on a supporting portion (not shown) for supporting the projection optical system PL, the detection system being composed of an illumination optical system 13 that sends imaging-beams for forming a plurality of slit-images toward the best-image plane of the projection optical system PL in an oblique direction relative to the optical axis AX direction and a light-receiving optical system 14 for receiving the imaging-beams reflected by the surface of the wafer W through respective slits. The stage control system 19 drives the wafer holder 25 in the Z-direction and tilts it based on the wafer position information from this multi-focal position detection system (13, 14). Such a multi-focal position detection system is disclosed in, for example, Japanese Patent Laid-Open No. 6-283403 and U.S. Pat. No. 5,448,332 corresponding thereto. The disclosure in the above Japanese Patent Laid-Open and U.S. Patent is incorporated herein by reference as long as the national laws in designated states or elected states, to which this international application is applied, permit.

The exposure apparatus 100 having the construction as described above detects the arrangement coordinates of shot areas on the wafer W in the way described below. As a premise of detecting the arrangement coordinates of shot areas it is assumed that the marks MX, MY have been already formed on the wafer W through prior processes for earlier layers. Furthermore, it is assumed that the wafer W was loaded on the wafer holder 25 by a wafer loader (not shown) and that the main control system 20 has already performed rough alignment (pre-alignment) via the stage control system 19, in which the wafer W is moved so that a mark MX or MY can be introduced into the observation sight (the sight area VXA for a mark X) of the alignment microscope AS. Such pre-alignment is performed via the stage control system 19 by the main control system 20 based on the results of observing the outer shape of the wafer W and marks MX, MY in a wide scope and position information (or speed information) from a wafer interferometer 18. Furthermore, not less than three X-position-detection marks $MX(i_m, j_m)$ (m=1 through M; M≥3) which are not on a line and not less than three Y-position-detection marks $MY(i_n, j_n)$ (n=1 through N; N≥3) which are not on a line have been selected, those marks being measured to detect the arrangement coordinates of shot areas. And the total number (=M+N) of the selected marks needs to be more than six.

In the below, the way of detecting the arrangement coordinates of shot areas on the wafer W will be described using a flow chart in FIG. 6 and other figures as needed.

Figure 6:
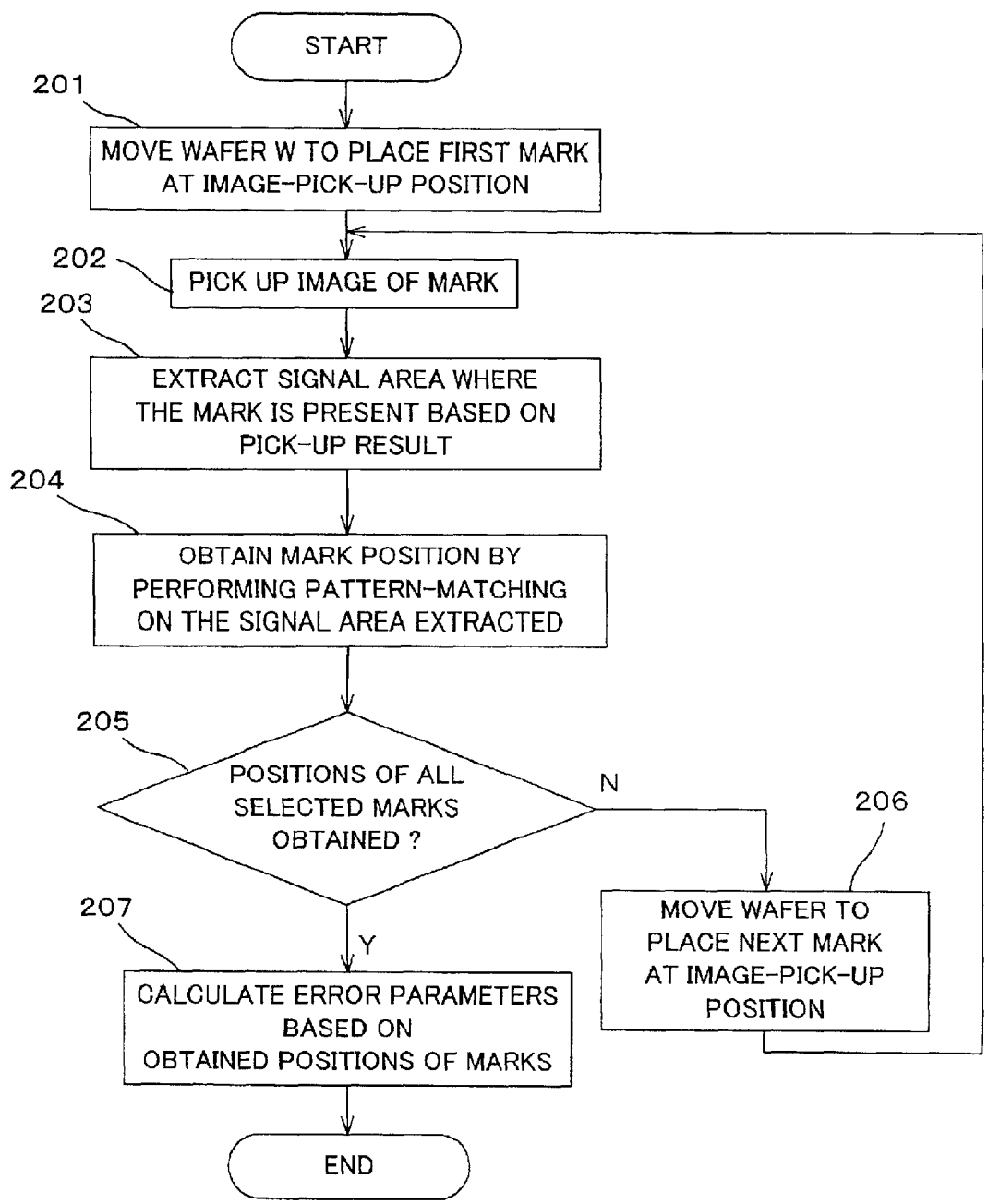
FIG. 6 is a flow chart for explaining the operation of detecting the positions of the marks.

In a step 201 of FIG. 6, the main control system 20 moves the wafer W via the stage control system 19 so that the first mark (X-position-detection mark $MX(i_1, j_1)$, herein) of the selected marks $MX(i_m, j_m)$, $MY(i_n, j_n)$ is introduced into the image-pick-up sight of the alignment microscope AS.

Subsequently, in a step 202 the alignment microscope AS picks up the image of the mark $MX(i_1, j_1)$. When the alignment microscope AS picks up the image of the mark $MX(i_1, j_1)$ in a state where the mark-formed area MXA and the sight area VXA are in the positional relation as shown in FIG. 3, the image on the wafer W as shown in FIG. 7A is obtained in the sight area VXA.

The picked-up data collection unit 31 receives and stores pick-up data IMD in the sight area VXA, picked up by the alignment microscope AS in the above way, in the picked-up-data storing area 41 according to instructions of the controller 39. By this, the pick-up data IMD is collected.

Referring back to FIG. 6, in a next step 203 the area calculation unit 33 reads the pick-up data concerning the mark $MX(i_1, j_1)$ from the picked-up-data storing area 41 according to instructions of the controller 39 and extracts the mark-formed area MXA of the mark $MX(i_1, j_1)$ based on the pick-up data and position information (or speed information) WPV from a wafer interferometer 18.

Figure 7A:
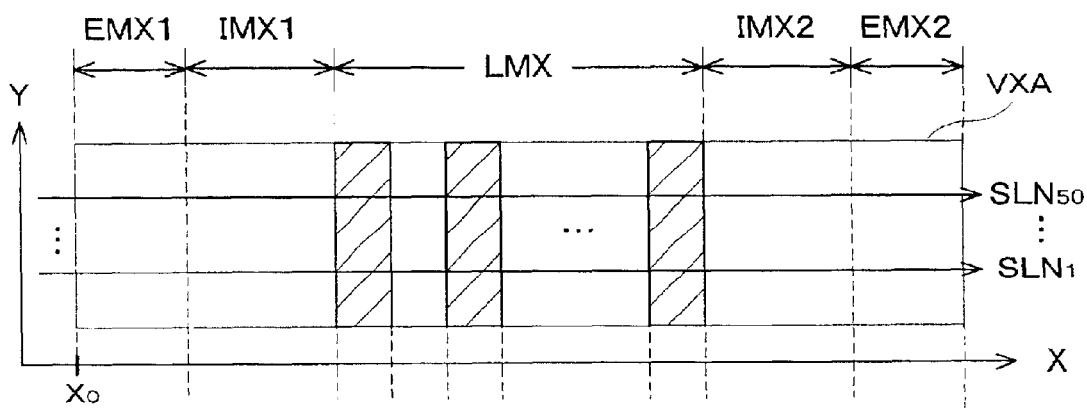
FIGS. 7A and 7B are views for explaining a result of picking up the image of the alignment mark of the embodiment.

Upon the area extracting, first the area calculation unit 33 extracts from the pick-up data of the mark $MX(i_1, j_1)$ signal-intensity distributions (light-intensity distributions) $I_1(X)$ to $I_{50}(X)$ measured along 50 scan lines $SLN_1$ to $SNL_{50}$ which extend in the X-direction and which are located around or in the center in the Y-direction of the sight area VXA as shown in FIG. 7A, and then calculates an average signal-intensity distribution I(X) given by the equation (1)

$$I(X) = \left[\sum_{i=1}^{50} I_i(X)\right] / 50 \quad (1)$$

Figure 7B:
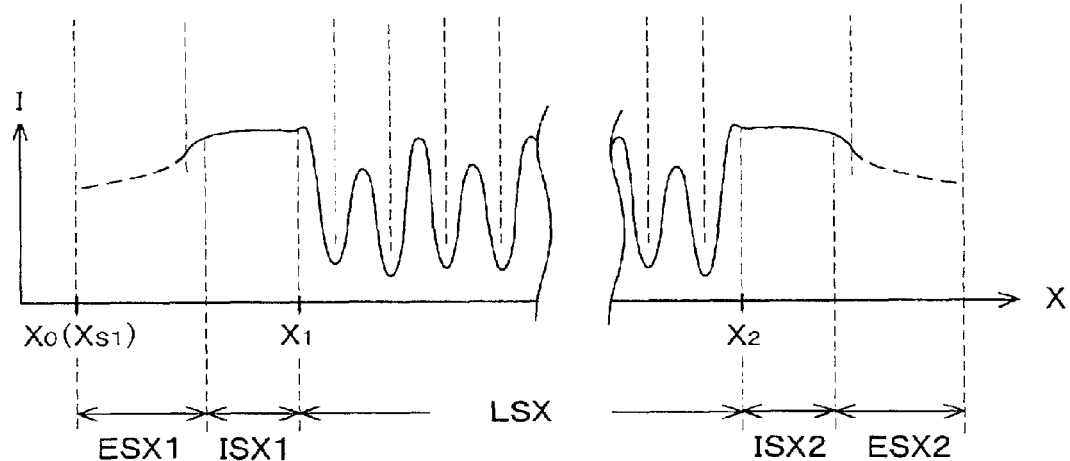

By this, the effect of high-frequency noises, superposed on the individual signal-intensity distributions $I_1(X)$ to $I_{50}(X)$, on the signal-intensity distribution I(X) is reduced. The signal-intensity distribution I(X) obtained in this way is shown in FIG. 7B.

Figure 8:
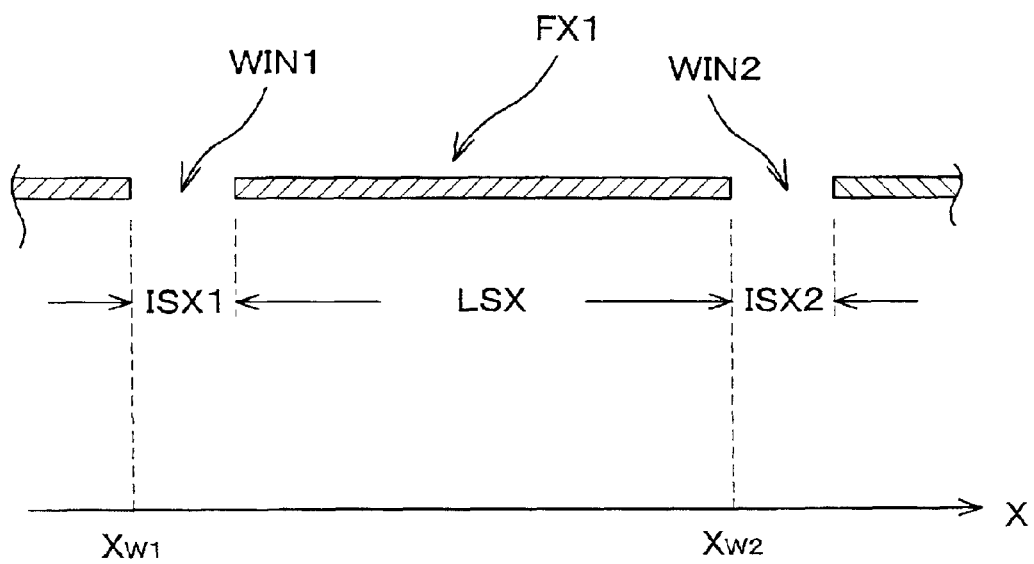
FIG. 8 is a schematic view for explaining a one-dimensional filter of the embodiment.

Next, the area calculation unit 33 provides, as conceptually shown in FIG. 8, a one-dimensional filter FX1 having a window WIN1 having a width of ISX1 and a window WIN2 having a width of ISX2, which are a length LSX apart from each other, made therein, the filter FX1 being implemented in a program. The one-dimensional filter FX1 functions as a filter for picking up only information in the windows WIN1, WIN2. In FIG. 8, $X_{W1}$ represents the X-position of the end point in the –X direction of the window WIN1, and $X_{W2}$ represents the X-position of the end point in the –X direction of the window WIN1. Because between the X-positions $X_{W1}$, $X_{W2}$ there is the following relation $$X_{W2} = X_{W1} + ISX1 + LSX \quad (2),$$

by determining $X_{W1}$ the X-position $X_{W2}$ is uniquely determined. Therefore, the position of the one-dimensional filter FX1 refers to the X-position $X_{W1}$.

Subsequently, the X-position $X_{W1}$ of the one-dimensional filter FX1 is aligned with the X-position $X_0$ (scan-start X-position $X_{S1}$) of the end point in the –X direction of the sight area VXA, and the one-dimensional filter FX1 is applied to the signal-intensity distribution I(X). This results in extracting parts of the signal-intensity distribution I(X) ($X_{S1} \leq X \leq X_{S1}+ISX1$, $X_{S1}+ISX1+LSX$ ($=X_{S2}$) $\leq X \leq X_{S2}+ISX2$). And for the parts of the signal-intensity distribution I(X) in the windows WIN1, WIN2, the average $\mu I(X_{W1}$ ($=X_{S1}$)), the variation $SI(X_{W1})$, and the variance $VI(X_{W1})$ are calculated using the following equations (3) to (5)

$$\mu I(X_{W1}) = \left\{\sum_{i=1}^{ISX1} I(X_{W1}+i) + \sum_{j=1}^{ISX2} I(X_{W2}+j)\right\} / (ISX1+ISX2) \quad (3)$$

$$SI(X_{W1}) = \sum_{i=1}^{ISX1} \{I(X_{W1}+i)\}^2 + \sum_{j=1}^{ISX2} \{I(X_{W2}+j)\}^2 \quad (4)$$

$$VI(X_{W1}) = SI(X_{W1})/(ISX1+ISX2) - \{\mu I(X_{W1})\}^2 \quad (5)$$

It is noted that while the calculation of the variance $VI(X_{W1})$ by the equation (5) does not take into account the decrease by one in the degrees of freedom due to the calculation of the average $\mu I(X_{W1})$, if taking it into account is necessary, the variance $VI(X_{W1})$ needs to be calculated using the equation (5)'

$$VI(X_{W1}) = (SI(X_{W1}) - (ISX1+ISX2)(\mu I(X_{W1}))^2)/(ISX1+ISX2-1) \quad (5)'$$

Next, until the end point in the +X direction of the window WIN2 comes to coincide with the end point in the +X direction of the sight area VXA, with running the one-dimensional filter FX1 in the +X direction by moving the X-position $X_{W1}$ of the one-dimensional filter FX1 in the +X direction pixel by pixel, the average $\mu I(X_{W1})$, the variation $SI(X_{W1})$, and the variance $VI(X_{W1})$ are calculated for the signal-intensity distribution I(X) in the windows WIN1, WIN2 at each value of the X-position $X_{W1}$ of the one-dimensional filter FX1. Needless to say, the above equations (3) through (5) can be used in calculating the average $\mu I(X_{W1})$, the variation $SI(X_{W1})$, and the variance $VI(X_{W1})$. However, between the average $\mu I(X_{W1})$, the variation $SI(X_{W1})$, the variance $VI(X_{W1})$, and an average $\mu I(X_{W1}+1)$, a variation $SI(X_{W1}+1)$, a variance $VI(X_{W1}+1)$ there are relations expressed by the following equations (6) through (8) respectively $$\mu I(X_{W1}+1)=\mu I(X_{W1})+[\{I(X_{W1}+ISX1+1)-I(X_{W1})\}+\{I(X_{W2}+ISX2+1)-I(X_{W2})\}]/(ISX1+ISX2) \quad (6)$$

$$SI(X_{W1}+1)=SI(X_{W1})+[\{I(X_{W1}+ISX1+1)\}^2-\{I(X_{W1})\}^2]+[\{I(X_{W2}+ISX2+1)\}^2-\{I(X_{W2})\}^2] \quad (7)$$

$$VI(X_{W1}+1)=SI(X_{W1}+1)/(ISX1+ISX2)-\{\mu I(X_{W1}+1)\}^2 \quad (8)$$

In this embodiment by using the above equations (6) through (8), the average $\mu I(X_{W1})$, the variation $SI(X_{W1})$ and the variance $VI(X_{W1})$ ($X_{W1} > X_{S1}$) can be calculated with a smaller amount of computation than the equations (3) through (5) need.

Incidentally, also as to the equation (8), if taking into account the degrees of freedom is needed, the same modification as was made to the equation (5) to obtain the equation (5)' is needed to calculate the variance $VI(X_{W1}+1)$.

And when the X-position $X_{W1}$ of the one-dimensional filter FX1 reaches the position $X_E$ $$X_E = LX - ISX1 - LSX - ISX2 \quad (9),$$

and the end point in the +X direction of the window WIN2 coincides with the end point in the +X direction of the sight area VXA, the running of the one-dimensional filter FX1 ends.

Figure 9:
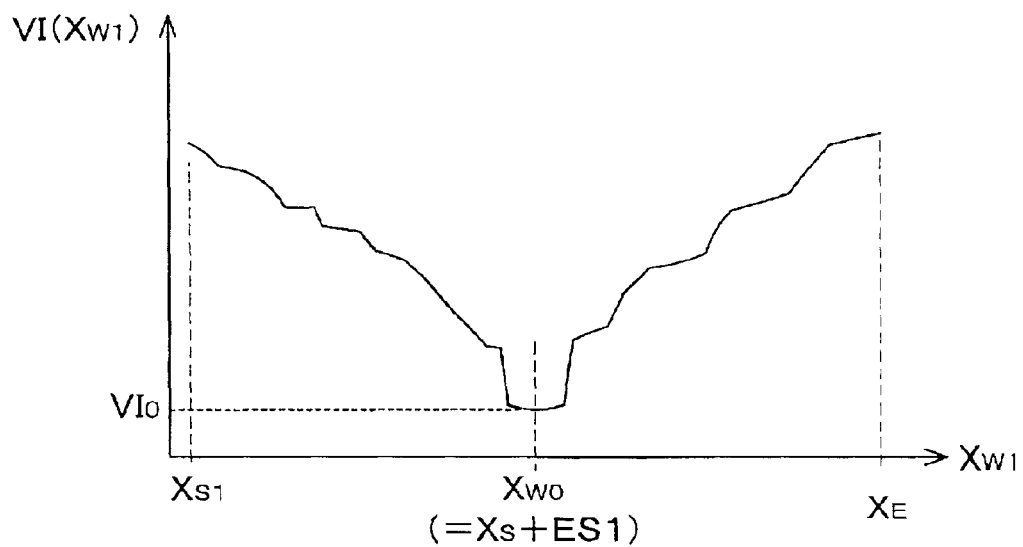
FIG. 9 is a graph showing the distribution of signal intensities through the one-dimensional filter in FIG. 8.

The variance $VI(X_{W1})$ out of the average $\mu I(X_{W1})$, the variation $SI(X_{W1})$ and the variance $VI(X_{W1})$ ($X_{S1} \leq X_{W1} \leq X_E$) as functions of the X-position $X_{W1}$ of the one-dimensional filter FX1 obtained in the above way is shown in FIG. 9. That is, although at the start of running the one-dimensional filter FX1, the signal-intensity distribution I(X) varies greatly in the windows WIN1, WIN2 so that the variance $VI(X_{W1})$ is large, as the one-dimensional filter FX1 advances, the windows WIN1, WIN2 come to cover the prohibited-band signal areas where the signal-intensity distribution I(X) varies much less. And as the prohibited-band signal areas occupy more of the windows WIN1, WIN2, the variance $VI(X_{W1})$ decreases, and when the prohibited-band signal areas coincide with the windows WIN1, WIN2 respectively, the variance $VI(X_{W1})$ takes on a minimum value $VI_0$. Then as the one-dimensional filter FX1 further advances, and the prohibited-band signal areas occupy less of the windows WIN1, WIN2, the variance $VI(X_{W1})$ increases.

According to this, the area calculation unit 33 detects a value $X_{W0}$ of the X-position $X_{W1}$ where the variance $VI(X_{W1})$ ($X_{S1} \leq X_{W1} \leq X_E$) calculated takes on the minimum value $VI_0$, to obtain the positions of the prohibited-band signal areas in the sight area VAX and thus the position of the mark-signal area. That is, because between the X-position's value $X_{W0}$ and the unknown ESX1 there is the relation $$X_{W0} = X_{S1} + ESX1 = X_0 + ESX1 \quad (10),$$

the area calculation unit 33 calculates the value ESX1 based on the equation (10). By this, it is found that the mark-signal area is an area from an X-position $X_1$ (=ESX1+ISX1) to an X-position $X_2$ (=ESX1+ISX1+LSX). And the area calculation unit 33 stores the X-position $X_1$, the X-position $X_2$ and the signal-intensity I(X) ($X_1 \leq X \leq X_2$) in the area-information storing area 42.

Next, the area calculation unit 33 calculates $$\mu I_0 = \mu I(X_{W0}) \quad (11)$$

$$\sigma I_0 = \{VI(X_{W0})\}^{1/2} \quad (12)$$

The value $\mu I_0$ given by the equation (11) represents the average of the signal-intensity I(X)'s values measured over the prohibited-band signal areas where the signal-intensity I(X) ideally takes on a constant value, and the value $\sigma I_0$ given by the equation (12) represents the standard deviation of the signal-intensity I(X)'s values measured over the prohibited-band signal areas. That is, the value $\mu I_0$ contains information obtained by normalizing image pick-up results in the step 202, and the value $\sigma I_0$ contains information concerning the noise level of the image pick-up results. Then the area calculation unit 33 stores the value $\mu I_0$ and the value $\sigma I_0$ in the area-information storing area 42, and the extraction of the mark-signal area ends.

Referring back to FIG. 6, in a step 204 the position calculation unit 35 reads the X-position $X_1$, the X-position $X_2$, the signal-intensity I(X) ($X_1 \leq X \leq X_2$), the value $\mu I_0$, and the value $\mu I_0$ from the area-information storing area 42 according to instructions of the controller 39, and obtains the X-position of the mark $MX(i_1, j_1)$ by matching a template-pattern concerning the signal-intensity I(X) obtained beforehand to the pattern of the signal-intensity I(X) ($X_1 \leq X \leq X_2$). In such pattern-matching, the degree of similarity (correlation coefficient) between the normalized template-pattern and the pattern of the signal-intensity I(X) in the mark-signal area ($X_1 \leq X \leq X_2$) normalized by the value $\mu I_0$ is computed with changing the positional relation between the two and taking account of a noise level presumed from the value $\sigma I_0$. By this, the relative position of the two where the degree of similarity is highest is obtained which gives the X-position of the mark $MX(i_1, j_1)$. And the position calculation unit 35 stores the X-position of the mark $MX(i_1, j_1)$ in the position-information storing area 43.

Next, a step 205 checks whether or not the computation of mark information for all marks selected is completed. Here, because only the mark information, the X-position, of the mark $MX(i_1, j_1)$ has been computed, the answer is NO, and the sequence proceeds to a step 206.

In the step 206, the controller 39 moves the wafer W so that a next mark is introduced into the image-pick-up sight of the alignment microscope AS, by moving the wafer stage WST with controlling the wafer-stage driving portion 24 via the stage control system 19 based on the results of pre-alignment.

Until the step 205 determines that the computation of mark information for all marks selected is completed, the X-positions of the marks $MX(i_m, j_m)$ (m=2 through M) and the Y-positions of the marks $MY(i_n, j_n)$ (n=1 through N) are computed in the same way as was described above for the mark $MX(i_1, j_1)$. When mark information for all the marks selected has been computed and stored in the position-information storing area 43, and the answer in the step 205 is YES, the sequence proceeds to a step 207.

In the step 207, the controller 39 reads the X-positions of the marks $MX(i_m, j_m)$ (m=1 through M) and the Y-positions of the marks $MY(i_n, j_n)$ (n=1 through N) from the position-information storing area 43, and, based on the X-positions of the marks $MX(i_m, j_m)$ and the Y-positions of the marks MY($i_n$, $j_n$) read, the values of error-parameters for calculating the arrangement coordinates of shot areas SA on the wafer using statistical computation disclosed in, e.g., Japanese Patent Laid-Open No. 61-44429 are calculated using statistical computation as disclosed in, for example, Japanese Patent Laid-Open No. 61-44429 and U.S. Pat. No. 4,780,617 corresponding thereto, and Japanese Patent Laid-Open No. 2-54103 and U.S. Pat. No. 4,962,318 corresponding thereto. The disclosures in the above Japanese Patent Laid-Opens and U.S. Patents are incorporated herein by reference as long as the national laws in designated states or elected states, to which this international application is applied, permit.

After that, the controller 39, using the arrangement coordinate of a given shot area SA obtained using the parameters' values calculated, synchronously moves the wafer W and the reticle R in opposite directions along the scanning direction (Y-direction) at a speed ratio corresponding to the projection ratio while the illumination light IL is irradiating the slit-shaped illumination area (whose center substantially coincides with the optical axis AX) on the reticle R. By this, the pattern of the pattern area on the retile R is reduced and transferred onto the given shot area on the wafer W.

Utilizing the pattern-prohibited-bands around the marks MX and MY as described above, the exposure apparatus 100 of this embodiment extracts, for each of marks MX and MY, a respective mark-signal area by, after measuring an area including the mark on the wafer W, obtaining a position of the one-dimensional filter FX1 where the variance of the signal intensity in the windows WIN1, WIN2 is smallest whose dimensions are equal to those of the prohibited-band signal areas respectively. As a result, where the mark-signal area is located in the sight area VXA can be detected accurately and quickly. By performing pattern-matching on the detected mark-signal area, the positions of the marks MX, MY on the wafer W can be detected accurately and quickly.

In detecting the positions of the alignment marks MX, MY, edge detection, conversion to binary, peak-detection, etc., of the picked-up image data are not needed, and thus position-detection highly robust against noise and accurate is possible.

Furthermore, because alignment of the wafer W is performed based on the positions of the alignment marks MX, MY accurately detected, accurate alignment is possible.

Moreover, because exposure is performed with accurately aligning the wafer W with a reticle, the pattern on the pattern area of the reticle R can be accurately transferred onto shot areas on the wafer W.

The exposure apparatus described above according to this invention is made by bringing together various sub-systems having various components so as to obtain mechanical accuracy, electrical accuracy and optical accuracy. In order to ensure these accuracies, before and after the assemblies, adjustment of the optical sub-system for achieving given optical accuracy, adjustment of the mechanical sub-system for achieving given mechanical accuracy, and adjustment of the electrical sub-system for achieving given electrical accuracy are performed. The process of assembling the exposure apparatus from these sub-systems includes connecting the sub-systems mechanically and electrically by wiring, and connecting air-pressure circuits by pipes. Needless to say, before assembling the exposure apparatus from these sub-systems, assembly for each sub-system has been performed. After the assembling of the exposure apparatus, overall adjustment is performed on the whole exposure apparatus in order to ensure various accuracies. It is remarked that the making of the exposure apparatus is preferably performed in a clean room where the temperature and cleanliness degree is controlled.

Note that although the above embodiment uses the two windows WIN1, WIN2 corresponding to the prohibited-band signal areas on both sides of the mark-signal area, using only one window is possible. In this case, when obtaining the variance of the signal intensity by running the window in the sight area VXA, two positions of the window (the one-dimensional filter), where the variance takes on a local minimum, corresponding to the prohibited-band signal areas on both sides of the mark-signal area are observed, and based on the two positions of the window, the mark-signal area can be extracted.

Moreover, in the case where the signal intensity is maximal and almost constant in the prohibited-band signal areas, by obtaining a position of the one-dimensional filter where the $\mu I(X_{W1})$ given by the equation (3) or (6) takes on a maximum value, the mark-signal area can be extracted.

Figure 10A:
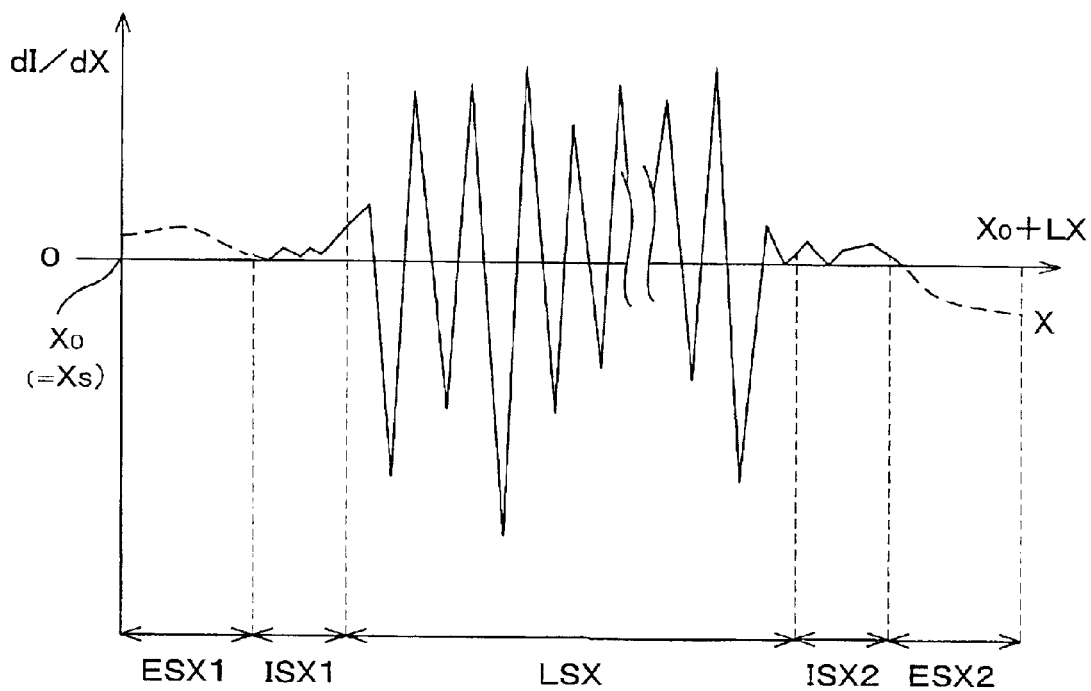
FIGS. 10A and 10B are views for explaining a modified example where the differential waveform is used.
Figure 10B:
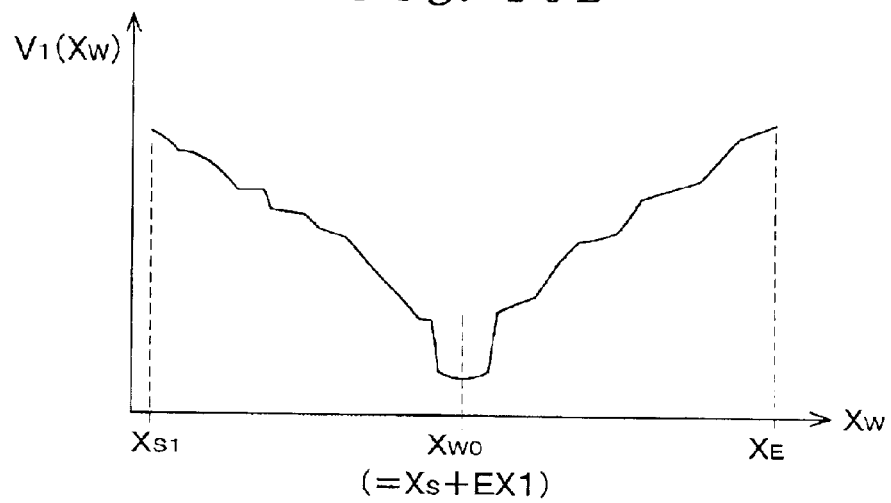

Furthermore, although the above embodiment uses the light intensity I(X) directly obtained from the results of picking up images in order to extract the mark-signal area, the first-order differential signal dI(X)/dX of the light intensity I(X) can be used as shown in FIG. 10A. In this case, signal values are almost zero in the prohibited-band signal areas, and the signal varies greatly taking on positive and negative values in the mark-signal area. That is, the signal varies gently in the prohibited-band signal areas and greatly in the mark-signal area as in the above embodiment. Therefore, when running the one-dimensional filter FX1 in the sight area VXA as in the above embodiment and calculating the variance $VI(X_{W1})$ of the first-order differential signal dI(X)/dX in the windows WIN1, WIN2, the variance $VI(X_{W1})$ varies with $X_{W1}$ as shown in FIG. 10B. Accordingly, by obtaining a position $X_{W0}$ of the one-dimensional filter FX1 where the variance $VI(X_{W1})$ takes on a minimum value in FIG. 10B, the mark-signal area can be extracted likewise.

Moreover, also in the case of using the h'th-order differential signal (h≧2) of the light intensity I(X), the signal varies gently in the prohibited-band signal areas and greatly in the mark-signal area as in the above embodiment. Therefore, the mark-signal area can be extracted likewise.

Incidentally, in the case of using the k'th-order differential signal (k≧1) of the light intensity I(X), the average and deviation given by equations (11) and (12) of the signal intensity at the position where the variance takes on a minimum value both reflect the magnitude of noise superposed on the k'th-order differential signal.

Figure 11A:
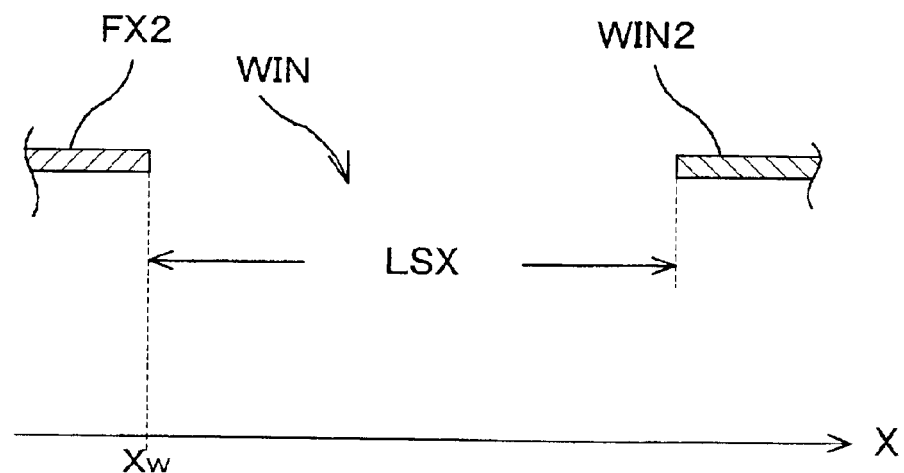
FIGS. 11A and 11B are views for explaining a modified example where a one-dimensional filter having a window corresponding to the mark-signal area therein is used.
Figure 11B:
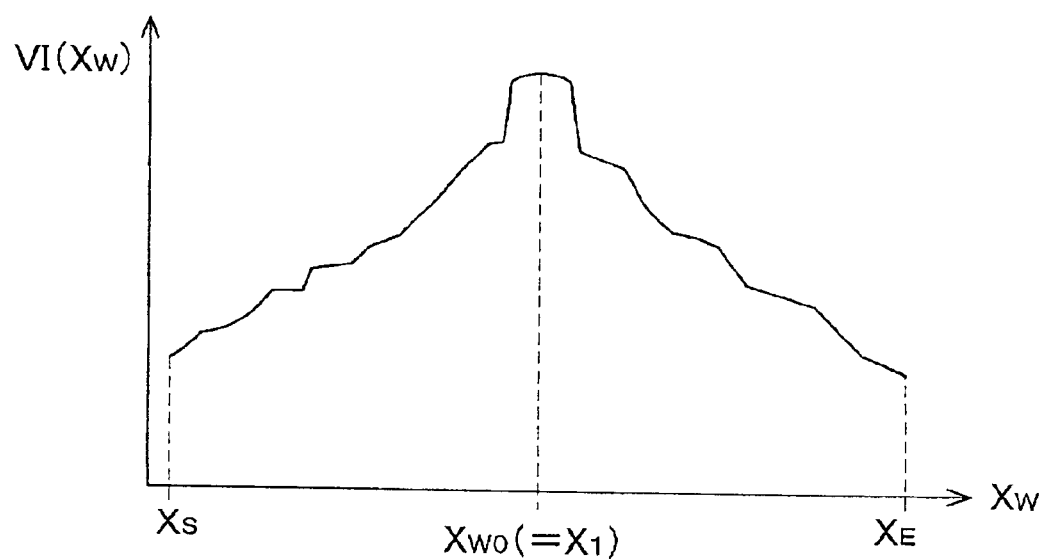

Furthermore, although the above embodiment utilizes the prohibited-band signal areas where the signal intensity varies gently and the one-dimensional filter FX1 having the windows corresponding to the prohibited-band signal areas, it is possible to use the mark-signal area for detecting the mark-signal area, where the signal intensity varies greatly over the width LSX. In this case, by running a one-dimensional filter FX2 having a window WIN having a width of LSX as shown in FIG. 11A in the sight area VXA and calculating the variance $VI(X_W)$ of the signal intensity I(X) in the window WIN as in the above embodiment, the variance $VI(X_W)$ shown in FIG. 11B is obtained which takes on a maximum value when the window WIN area coincides with the mark-signal area. Therefore, by obtaining a position $X_{W0}$ (=$X_1$) of the one-dimensional filter FX2 where the variance $VI(X_W)$ takes on a maximum value in FIG. 11B, the mark-signal area can be extracted.

In this case, the average $\mu I(X_W)$, the variation $SI(X_W)$, and the variance $VI(X_W)$ are calculated for the signal-intensity distribution I(X) in the window WIN by using equations (13) through (18) in place of the above equations (3) through (8).

$$SI(X_W) = \sum_{i=1}^{LSX} \{I(X_W + i)\}^2 \qquad (13)$$

$$\mu I(X_W) = \left\{ \sum_{i=1}^{LSX} I(X_W + i) \right\} / LSX \qquad (14)$$

$$VI(X_W) = SI(X_W)/LSX - \{\mu I(X_W)\}^2 \qquad (15)$$

$$\mu I(X_W+1) = \mu I(X_W) + \{I(X_W+LSX+1) - I(X_W)\}/LSX \qquad (16)$$

$$SI(X_W+1) = SI(X_W) + [\{I(X_W+LSX+1)\}^2 - \{I(X_W)\}^2] \qquad (17)$$

$$VI(X_W+1) = SI(X_W+1)/LSX - \{\mu I(X_W+1)\}^2 \qquad (18)$$

It is noted that if taking into account the decrease in the degrees of freedom is needed for the equations (13) through (18), similar modification to that in the above embodiment needs to be made to calculate the variance $VI(X_W)$.

Moreover, in order to obtain normalized information and noise-level information that can be used when calculating the position of the mark later, after extracting the mark-signal area, the prohibited-band signal areas on both sides of the mark-signal area need to be identified, and the average and variance of the signal intensity need to be calculated for the prohibited-band signal areas.

Incidentally, also in the case of using the one-dimensional filter FX2, the k'th-order differential signal ($k \geq 1$) of the light intensity I(X) can be used.

Figure 2B:
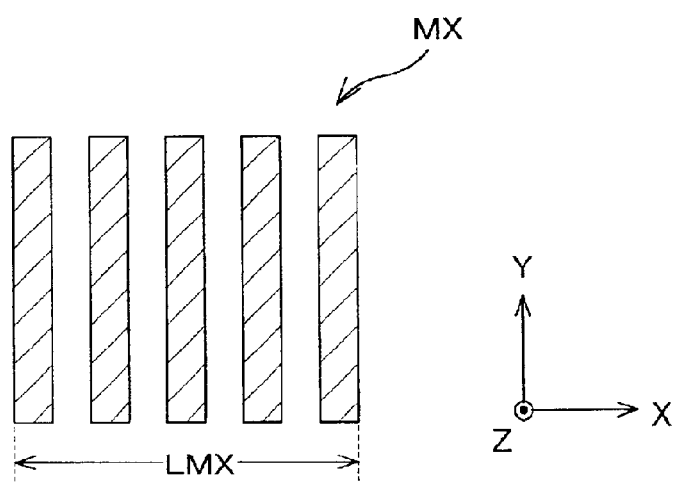
Figure 12A:
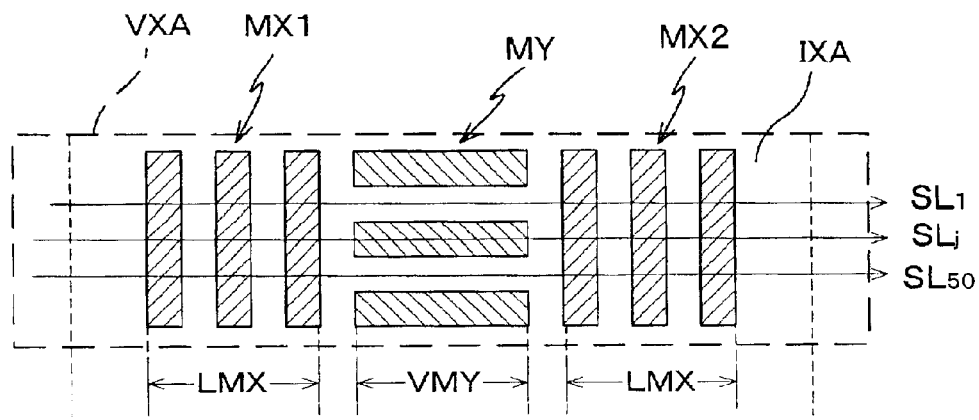
FIGS. 12A to 12D are views for explaining the shape of a two-dimensional mark (a first modified example) and a signal waveform thereof.

Moreover, although the above embodiment uses the line-and-space-pattern, a one-dimensional mark, as shown in FIG. 2B as a mark, a two-dimensional position-detection mark can be used which comprises mark MX1 for detecting the X-position, mark MY for detecting the Y-position and mark MX2 for detecting the X-position, which are disposed in the X-direction as shown in FIG. 12A. Such two-dimensional position-detection mark is suitable for calculating the arrangement coordinates of shot areas on a wafer W and coordinates in the shot areas by employing statistical computation disclosed in, e.g., Japanese Patent Laid-Open No. 6-275496.

Figure 12B:
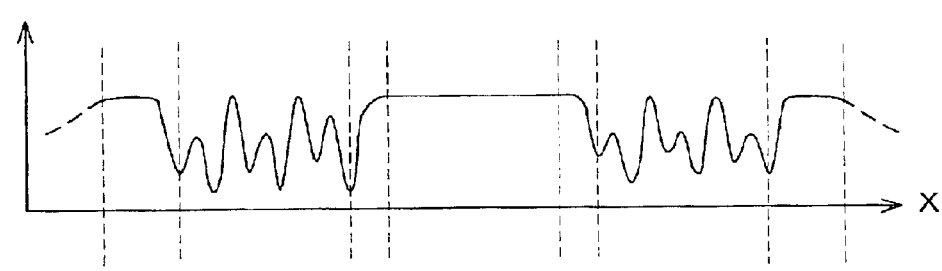
Figure 12C:
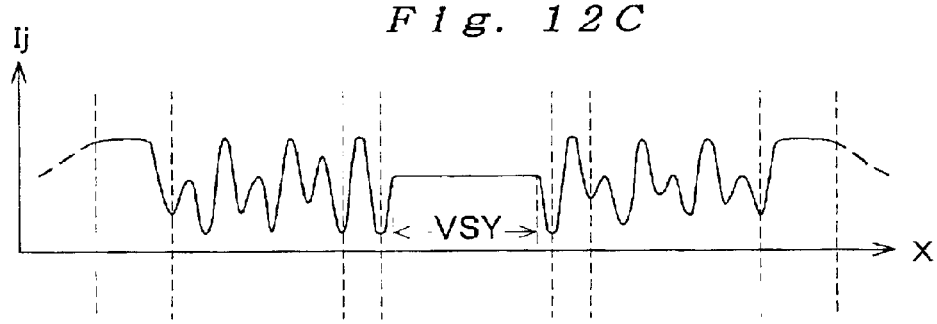
Figure 12D:
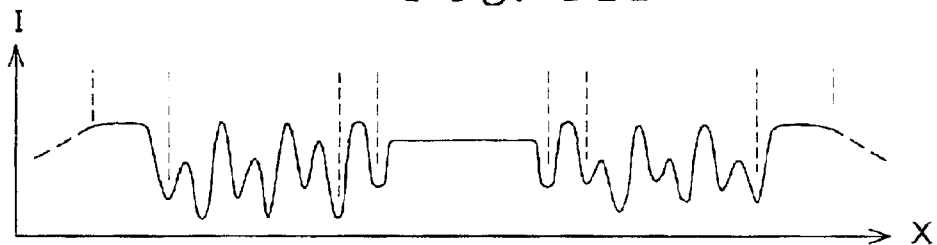

Also when detecting the X-position and Y-position of the two-dimensional mark in FIG. 12A, it is possible to extract mark-signal areas in view of prohibited-band signal areas or mark-signal areas in the same way as in the above embodiment. However, when detecting mark-signal areas for the X-direction, the mark-signal areas can be detected utilizing a mark-signal area having a width of VSY corresponding to the mark MY. That is, along scan lines $SL_1$ through $SL_{50}$ in the mark-signal area corresponding to the mark MY, the signal intensity of a space portion is almost at a constant value as representatively shown with respect to the scan line $SL_1$ in FIG. 12B, and the signal intensity of a line portion is almost at another constant value as representatively shown with respect to the scan line $SL_j$ in FIG. 12C. Therefore, by calculating the average over the scan lines $SL_1$ through $SL_{50}$ at each X-position, the signal intensity is almost at a constant value as shown in FIG. 12D in the mark-signal area having the width of VSY corresponding to the mark MY, which value is between the constant values for the space and line portions of the signal intensity, and the area having a long length over which the signal intensity is almost at a constant value is unique in the sight area VXA.

Figure 13A:
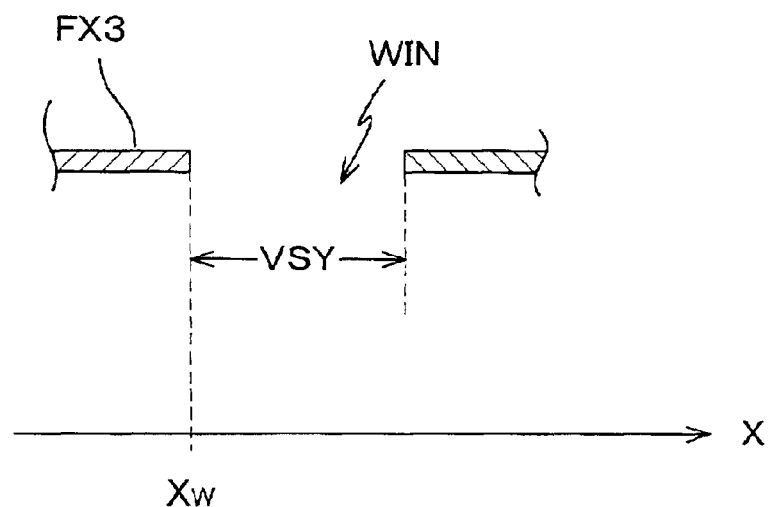
FIGS. 13A and 13B are views for explaining a filter for the two-dimensional mark (the first modified example) and the distribution of variances.
Figure 13B:
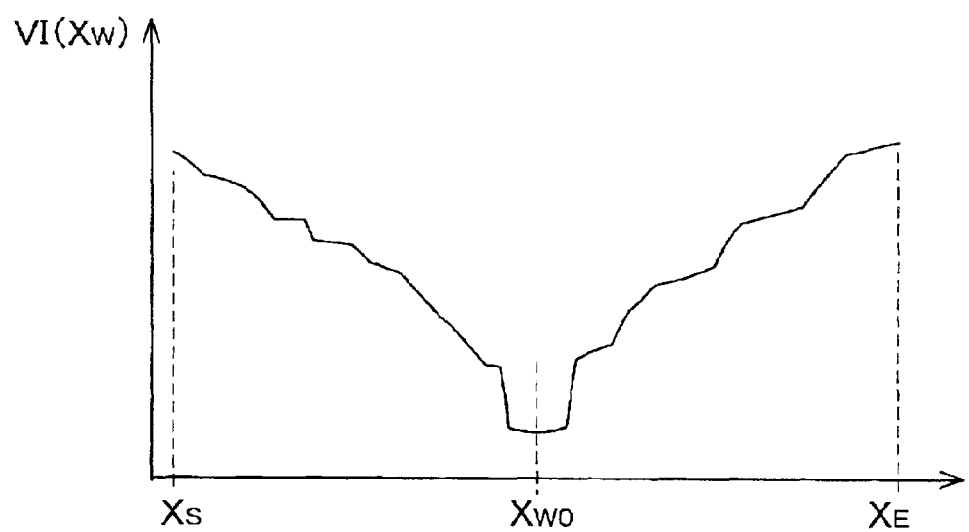

Therefore, by running a one-dimensional filter FX3 having a window WIN having a width of VSY as shown in FIG. 13A in a sight area VXA and calculating the variance $VI(X_W)$ in the same way as in the above embodiment, the variance $VI(X_W)$ shown in FIG. 13B is obtained which takes on a minimum value when the window WIN area coincides with the mark-signal area corresponding to the mark MY. Therefore, by obtaining a position $X_{W0}$ of the one-dimensional filter FX3 where the variance $VI(X_W)$ takes on a minimum value in FIG. 13B, the mark-signal area can be extracted.

Figure 14A:
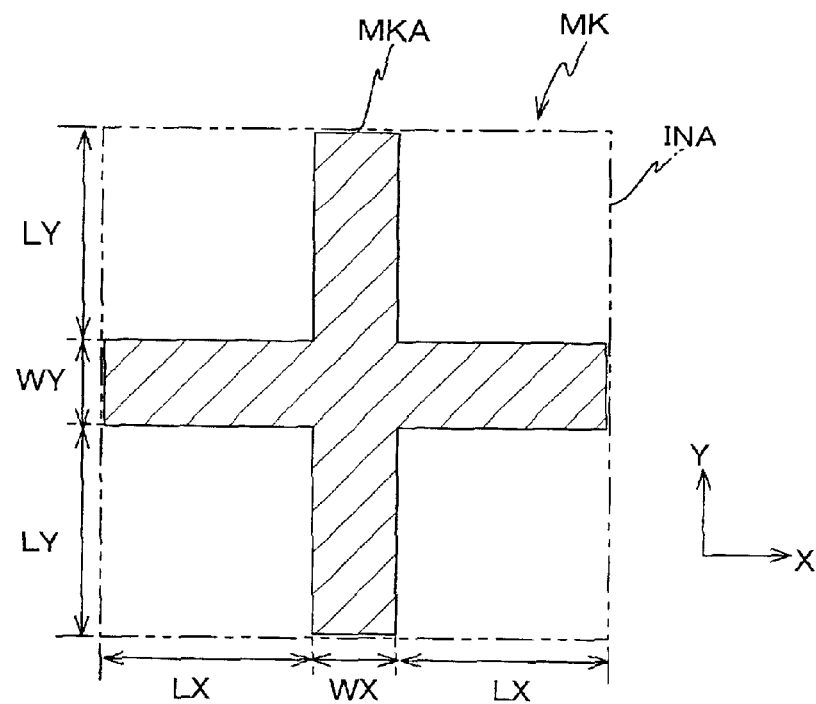
FIGS. 14A and 14B are views for explaining the shape of a two-dimensional mark (a second modified example) and a two-dimensional filter therefor.

Also in the case of using a cross-shaped, two-dimensional mark MK as shown in FIG. 14A, when detecting the X-position and Y-position, mark-signal areas can be extracted utilizing prohibited-band signal areas or mark-signal areas likewise. It is noted that as shown in FIG. 14A a mark-formed area MKA is in the shape of a cross which comprises a rectangle having a width in the X-direction of WX and a length in the Y-direction of about (2LY+WY) and a rectangle having a width in the Y-direction of WY and a length in the X-direction of about (2LX+WX), which rectangles are perpendicular to each other. In addition, a pattern-prohibited area INA comprises four rectangles each having a dimension in the X-direction of LX and a dimension in the Y-direction of LY, which rectangles are arranged in a matrix with two rows and two columns.

When the mark-formed area MKA and pattern-prohibited area INA are actually formed on a wafer W, a mark-signal area is slightly larger than the mark-formed area MKA and has the same shape while a prohibited-band signal area is slightly smaller than the pattern-prohibited area INA, as in FIG. 3. That is, the prohibited-band signal area has the arrangement of a matrix with two rows and two columns whose element is a rectangle having a dimension in the X-direction of WLX (<LX) and a dimension in the Y-direction of WLY (<LY). Next, the example of extracting the mark-signal area will be described utilizing the prohibited-band signal area.

Figure 14B:
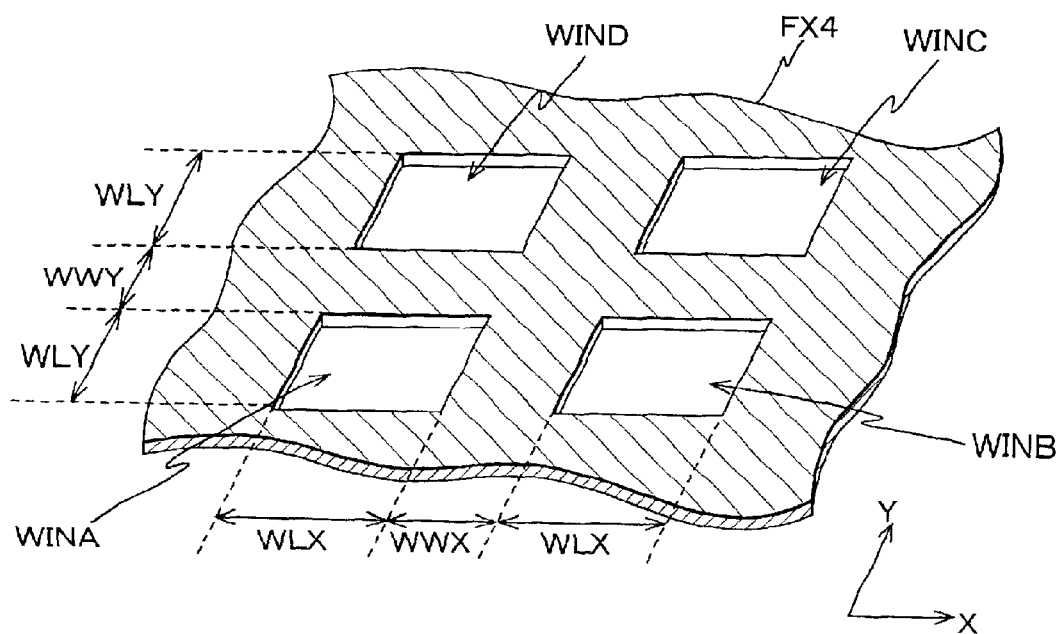

For extracting the mark-signal area a two-dimensional filter FX4 as shown in FIG. 14B is provided. The two-dimensional filter FX4 has four windows WINA, WINB, WINC, WIND each of which has a dimension in the X-direction of WLX and a dimension in the Y-direction of WLY, which correspond to the four sub-areas of the prohibited-band signal area, the windows WINA, WINB of which are a distance WWX (>WX) apart in the X-direction from each other, and the windows WINA, WIND of which are a distance WWY (>WY) apart in the Y-direction from each other. Also the windows WIND, WINC are the distance WWX apart in the X-direction from each other, and the windows WINB, WINC are the distance WWY apart in the Y-direction from each other.

It is assumed that the widths WLX, WLY and distances WWX, WWY are known as the width LSX in the X-direction of the mark-signal area and the widths ISX1, ISX2 of the prohibited-band signal areas in the above embodiment are. And such broad areas, where the signal intensity is almost at a constant value, are unique in the sight area.

Figure 15:
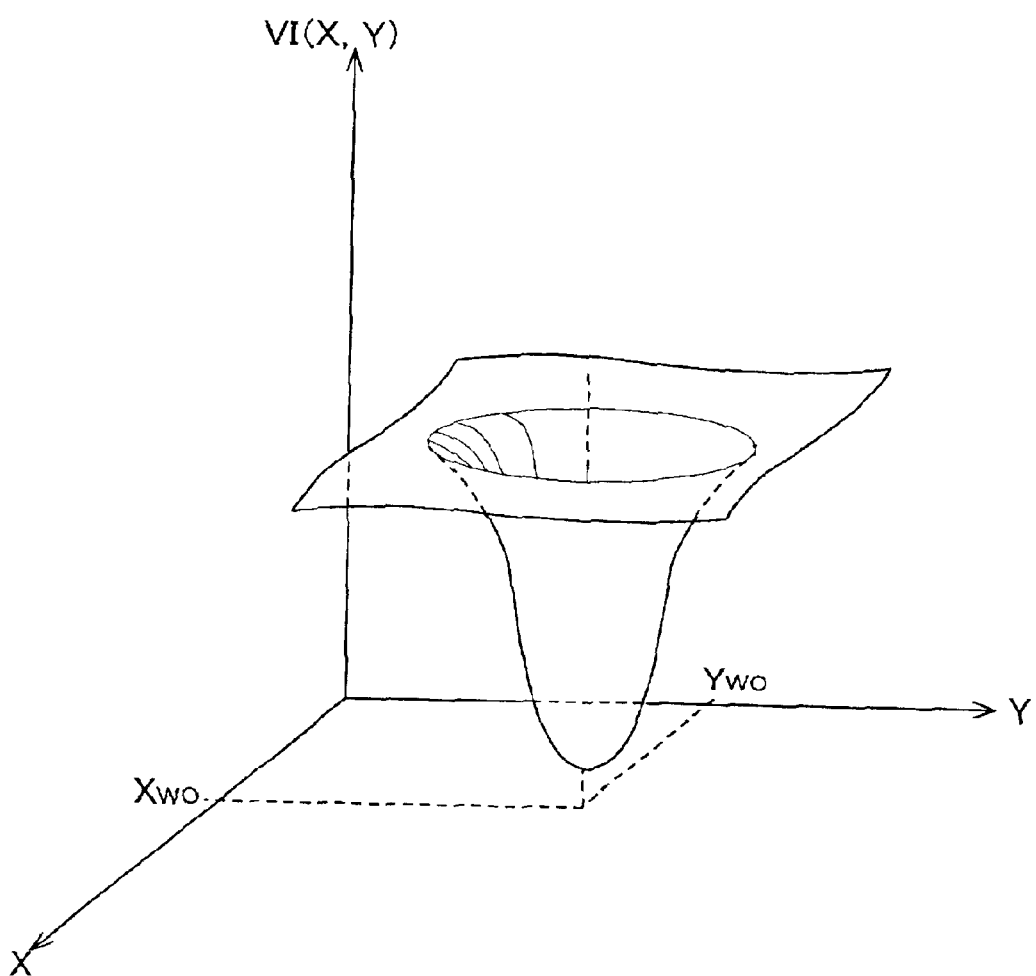
FIG. 15 is a view for explaining the distribution of variances in the case of the two-dimensional mark (the second modified example)

Therefore, by running the two-dimensional filter FX4 as shown in FIG. 14B in a sight area VXA in two dimensions and calculating the variance $VI(X_W, Y_W)$ of the signal-intensities in the windows WINA, WINB, WINC, WIND in the same way as in the above embodiment, the variance $VI(X_W, Y_W)$ shown in FIG. 15 is obtained which takes on a minimum value when the windows coincide with the prohibited-band signal areas of the mark MK. Therefore, by obtaining a position $(X_{W0}, Y_{W0})$ of the two-dimensional filter FX4 where the variance $VI(X_W, Y_W)$ takes on a minimum value in FIG. 15, the mark-signal area can be extracted.

It is noted that when calculating the variance $VI(X_W, Y_W)$ at each position $(X_W, Y_W)$ of the two-dimensional filter FX4, at a scan-start point the variance $VI(X_W, Y_W)$ needs to be calculated based on signal-intensities of all the windows WINA through WIND, while the calculation amount in calculating the variance $VI(X_W, Y_W)$ after that can be reduced using difference equations similar to the above equations (6) through (8).

Figure 16:
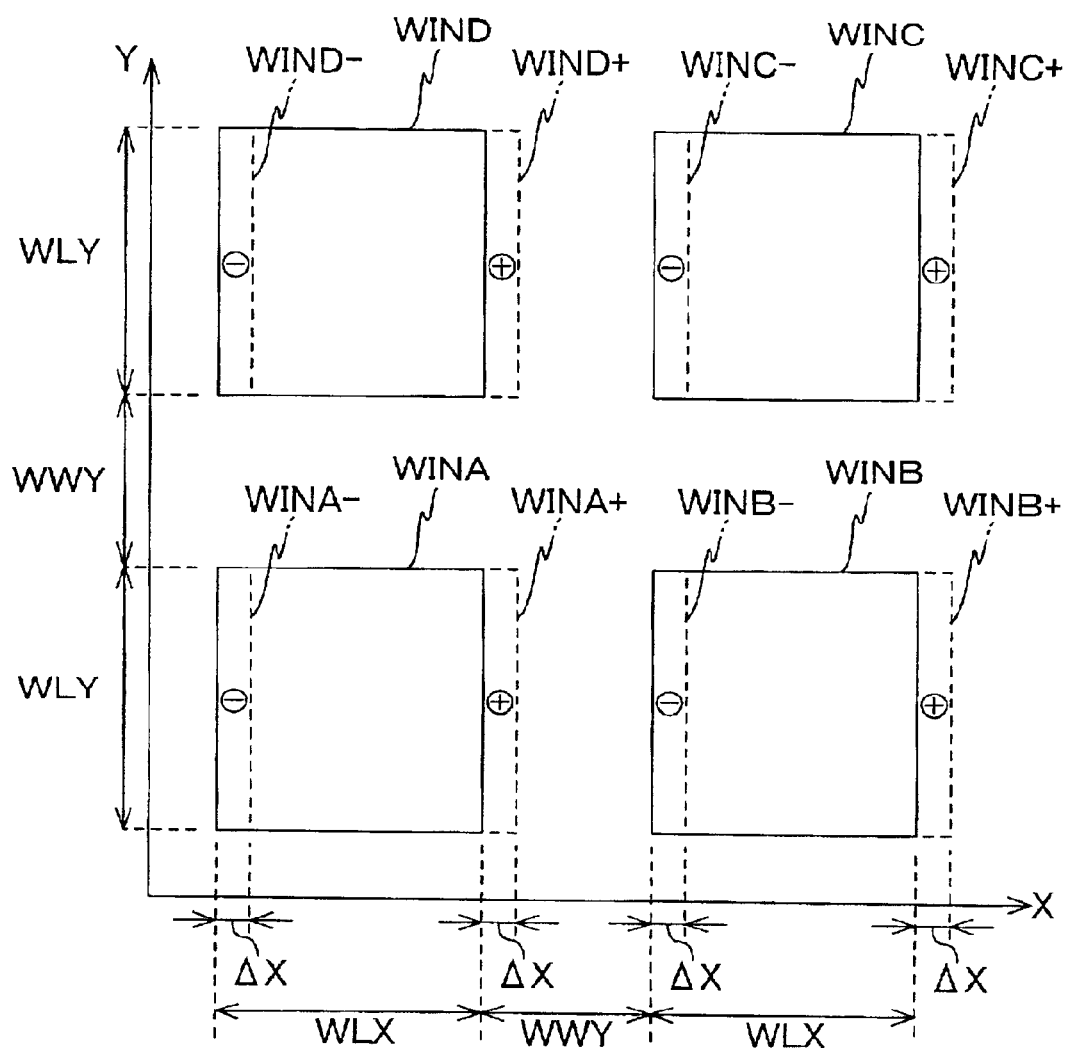
FIG. 16 is a view for explaining an exemplary method of calculating variances in the case of the two-dimensional mark (the second modified example)

Consider, for example, that as shown in FIG. 16, the bottom left corner of the window WINA (hereinafter, referred to as "the position of the two-dimensional filter FX4") moves from $(X_W, Y_W)$ to $(X_W + \Delta X, Y_W)$, where $\Delta X$ denotes a unit distance for movement in the X-direction. Here, it is assumed that the average $\mu I(X_W, Y_W)$, the variation $SI(X_W, Y_W)$, and the variance $VI(X_W, Y_W)$ of the signal-intensities have been already calculated at the position $(X_W, Y_W)$ of the two-dimensional filter FX4.

In this case, the average $\mu I(X_W + \Delta X, Y_W)$, the variation $SI(X_W + \Delta X, Y_W)$, and the variance $VI(X_W + \Delta X, Y_W)$ of the signal-intensities at the position $(X_W + \Delta X, Y_W)$ can be calculated using difference equations similar to the above equations (6) through (8), based on the average $\mu I(X_W, Y_W)$, the variation $SI(X_W, Y_W)$, and the variance $VI(X_W, Y_W)$, and the average $\mu I-(X_W, Y_W)$, the variation $SI-(X_W, Y_W)$, and the variance $VI-(X_W, Y_W)$ of the signal-intensities in areas WINA−, WINB−, WINC−, WIND− which are left behind due to the movement of the two-dimensional filter FX4, and the average $\mu I+(X_W, Y_W)$, the variation $SI+(X_W, Y_W)$ and the variance $VI+(X_W, Y_W)$ of the signal-intensities in areas WINA+, WINB+, WINC+, WIND+ which get into the windows WINA, WINB, WINC, WIND due to the movement of the two-dimensional filter FX4. Therefore, in calculating the variance $VI(X_W + \Delta X, Y_W)$ the signal-intensities from all pixels in the windows WINA, WINB, WINC, WIND need not be used. Instead, it is calculated based on the average $\mu I-(X_W, Y_W)$, the variation $SI-(X_W, Y_W)$, and the variance $VI-(X_W, Y_W)$ of the signal-intensities in the areas WINA−, WINB−, WINC−, WIND−, and the average $\mu I+(X_W, Y_W)$, the variation $SI+(X_W, Y_W)$, and the variance $VI+(X_W, Y_W)$ of the signal-intensities in the areas WINA+, WINB+, WINC+, WIND+ as well as the average $\mu I(X_W, Y_W)$, the variation $SI(X_W, Y_W)$, and the variance $VI(X_W, Y_W)$, reducing the calculation amount.

Also when running the two-dimensional filter FX4 in the Y-direction, the values of the average $\mu I(X_W, Y_W)$, the variation $SI(X_W, Y_W)$, and the variance $VI(X_W, Y_W)$ can be sequentially calculated likewise.

Therefore, the calculation amount is greatly reduced, and the position can be detected quickly.

Figure 17:
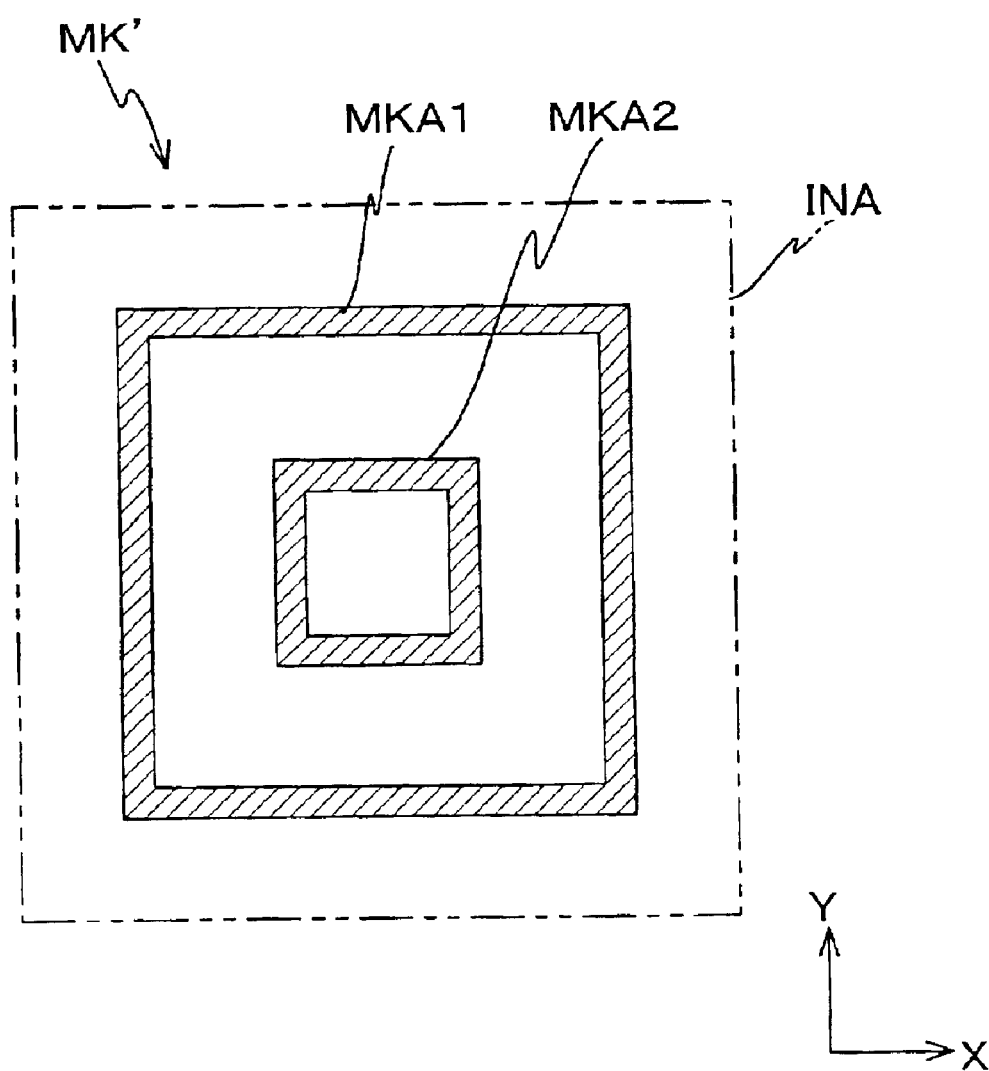
FIG. 17 is a view showing the shape of a two-dimensional mark (a third modified example)
Figure 18A:
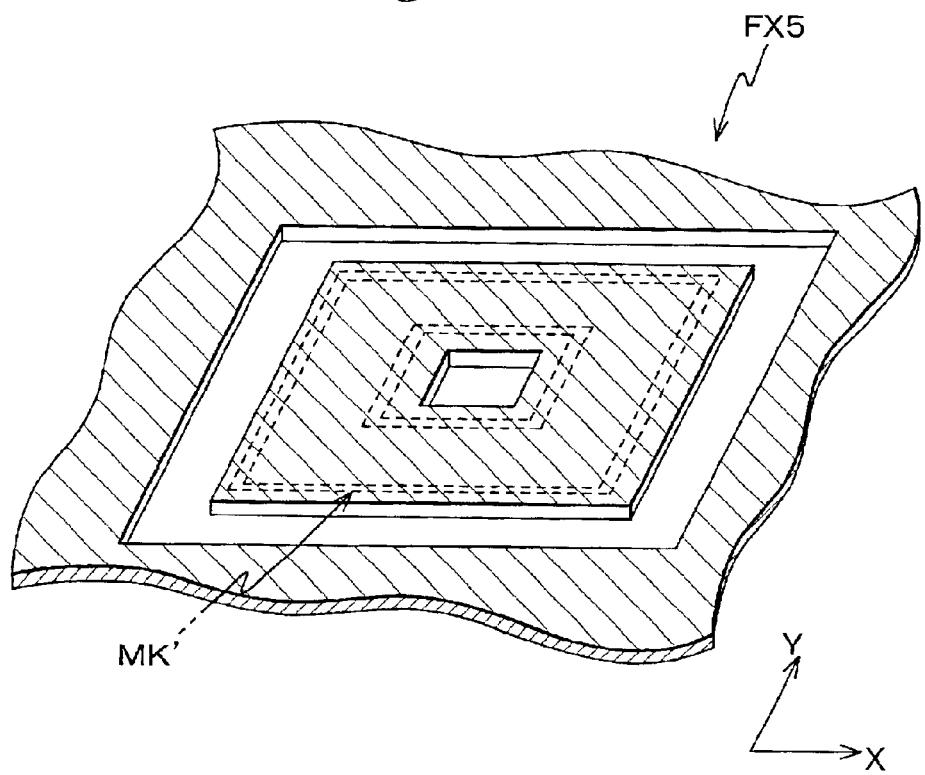
FIGS. 18A and 18B are views for explaining exemplary, two-dimensional filters for the two-dimensional mark (the third modified example)
Figure 18B:
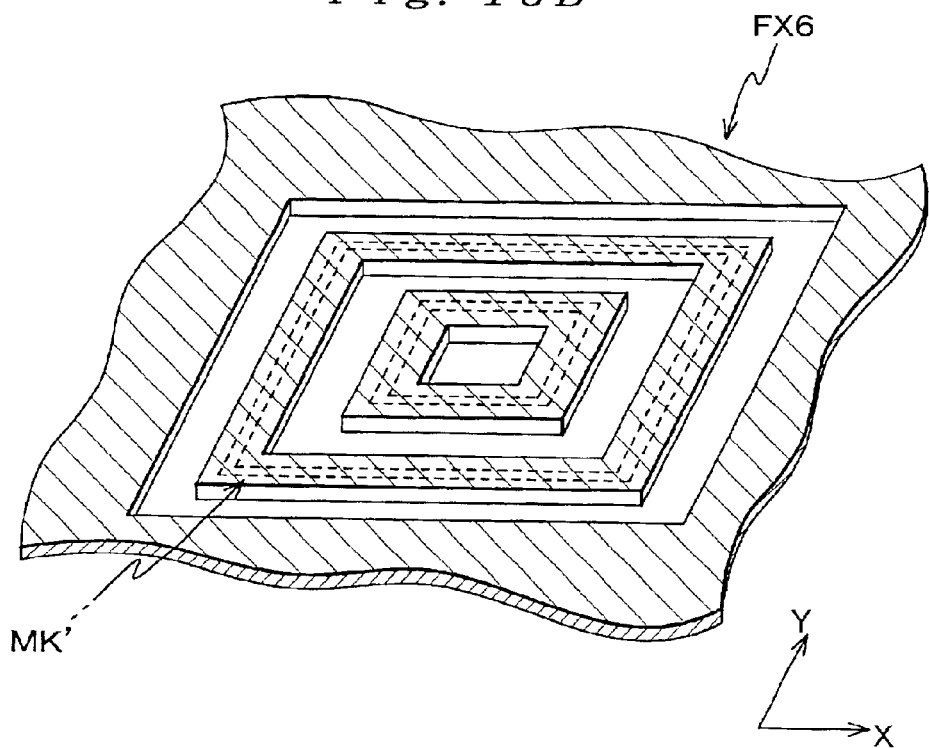

Also in the case of using a box-in-box-type, two-dimensional mark MK' having mark-formed areas MKA1, MKA2 and a pattern-prohibited area INX as shown in FIG. 17, in view of prohibited-band signal areas or mark-signal areas the mark-signal areas can be extracted for detecting the X- and Y-positions likewise, in which case, by using a two-dimensional filter FX5 having a shape shown in FIG. 18A or a two-dimensional filter FX6 having a shape shown in FIG. 18B, the mark-signal areas can be extracted utilizing the prohibited-band signal areas as in the above embodiment.

Incidentally, in the case of using the cross-shaped, two-dimensional mark MK in FIG. 14A or the box-in-box-type, two-dimensional mark MK' in FIG. 17 the mark-signal area can be extracted utilizing the mark-signal area as in the case of the above one-dimensional mark, needless to say.

Although the above embodiment uses marks formed on street lines, this invention is not limited to marks formed on street lines. Furthermore, arrangement coordinates of shot areas may be calculated using street lines themselves as marks.

Incidentally, also in the case of using the one-dimensional filter FX2, the k'th-order differential signal $(k \geq 1)$ of the light intensity I(X) can be used.

Needless to say, this invention can be applied to marks having other shapes.

While the above embodiment runs the window pixel by pixel in a predetermined direction, the window may be run N pixels by N pixels in a predetermined direction, where N represents an integer.

While the alignment method of the above embodiment is of the off-axis type that directly detects the positions of alignment marks on a wafer not through the projection optical system, a TTL (Through-The-Lens) type that detects the positions of alignment marks on a wafer through the projection optical system or a TTR (Through-The-Reticle) type that observes a wafer and a reticle simultaneously through the projection optical system may be employed. Incidentally, in the case of using an alignment method of the TTR type, the position of a wafer mark formed on the wafer at which the deviation between a reticle mark formed on the reticle and the wafer mark is zero is detected upon sample-alignment.

Moreover, instead of obtaining arrangement coordinates of shot areas, step intervals between shot areas may be obtained in order to move the wafer so that shot areas can be sequentially exposed.

While the optical integrator (homogenizer) of the above embodiment is a fly-eye lens, instead a rod-integrator may be used. In an illumination optical system employing a rod-integrator, the rod-integrator is disposed such that the emitting face thereof is substantially conjugate to the pattern face of the reticle R. Such an illumination optical system employing a rod-integrator is disclosed in, for example, U.S. Pat. No. 5,675,401, which is incorporated herein by reference as long as the national laws in designated states or elected states, to which this international application is applied, permit. Moreover, a double optical integrator having the combination of a fly-eye lens and a rod-integrator, or two fly-eye lenses or rod-integrators connected in series therein may be employed.

While the above embodiment describes the case where this invention is applied to a scan-type exposure apparatus of the step-and-scan type, not being limited to this, this invention can be suitably applied to a stationary-exposure-type exposure apparatus such as a stepper.

Additionally, in an exposure apparatus employing, e.g., ultraviolet light, a reflection system composed only of reflection optical elements or a reflection-refraction system (catadioptric system) having reflection optical elements and refraction optical elements may be used as the projection optical system. As the reflection-refraction type of projection optical system, a reflection-refraction system having a beam-splitter and concave mirror as reflection optical elements, which system is disclosed in, for example, Japanese Patent Laid-Open No. 8-171054 and U.S. Pat. No. 5,668,672 corresponding thereto, and Japanese Patent Laid-Open No. 10-20195 and U.S. Pat. No. 5,835,275 corresponding thereto, or a reflection-refraction system not having a beam-splitter but having a concave mirror, etc., as reflection optical elements, which system is disclosed in, for example, Japanese Patent Laid-Open No. 8-334695 and U.S. Pat. No. 5,689,377 corresponding thereto, and Japanese Patent Laid-Open No. 10-3039 and U.S. patent application Ser. No. 873,605 corresponding thereto (application date: Jun. 12, 1997), may be used. The disclosures in the above Japanese Patent Laid-Opens, U.S. Patents and U.S. Patent Application are incorporated herein by reference as long as the national laws in designated states or elected states, to which this international application is applied, permit.

Also, a reflection-refraction system can be employed which comprises a plurality of refraction optical elements and two mirrors (a main mirror being a concave mirror and a sub-mirror that is a back surface mirror whose reflection surface is formed on the opposite side of a refraction element or plane parallel plate to the incident surface) that are disposed along one axis, and which has the intermediate image, formed by those refraction optical elements, of a reticle pattern again imaged on a wafer using the main mirror and sub-mirror, the reflection-refraction system being disclosed in Japanese Patent Laid-Open No. 10-104513 and U.S. Pat. No. 5,488,229 corresponding thereto. In this reflection-refraction system, the main mirror and sub-mirror are disposed in series with the plurality of refraction optical elements, and an illumination light passes through a portion of the main mirror, is reflected by the sub-mirror and the main mirror in turn, passes through a portion of the sub-mirror and reaches the wafer. The disclosure in the above Japanese Patent Laid-Open and U.S. Patent is incorporated herein by reference as long as the national laws in designated states or elected states, to which this international application is applied, permit.

Furthermore, as the reflection-refraction-type projection optical system, a reduction system may be employed which has, e.g., a circular image field, which is telecentric on both the object plane side and image plane side, and which has a reduction ratio of, e.g., ¼ or ⅕. Also, in a scan-type exposure apparatus comprising this reflection-refraction-type projection optical system, the illumination area of the illumination light may be a rectangular-slit-shaped area whose center almost coincides with the optical axis of the projection optical system and which extends in a direction almost perpendicular to the scanning direction of a reticle or wafer. By using a scan-type exposure apparatus comprising such a reflection-refraction-type projection optical system, it is possible to accurately transfer a fine pattern having features of about 100 nm Line/Space onto wafers even with $F_2$ laser light having, for example, a wavelength of 157 nm as exposure light.

Furthermore, as a vacuum ultraviolet light, ArF excimer laser light or $F_2$ laser light is used. However, in the case where only a beam-monitor mechanism and reference wavelength light source are housed in the same environment-controlling chamber as the projection optical system is, a higher harmonic wave may be used which is obtained with wavelength conversion into ultraviolet by using non-linear optical crystal after having amplified a single wavelength laser light, infrared or visible, emitted from a DFB semiconductor laser device or a fiber laser by a fiber amplifier having, for example, erbium (or erbium and ytterbium) doped.

For example, considering that the oscillation wavelength of a single wavelength laser is in the range of 1.51 to 1.59 um, an eight-time-higher harmonic wave of which the wavelength is in the range of 189 to 199 nm or a ten-time-higher harmonic wave of which the wavelength is in the range of 151 to 159 nm is emitted. Especially, when the oscillation wavelength is in the range of 1.544 to 1.553 um, an eight-time-higher harmonic wave whose wavelength is in the range of 193 to 194 nm, that is, almost the same as ArF excimer laser light (ultraviolet light) is obtained, and when the oscillation wavelength is in the range of 1.57 to 1.58 um, a ten-time-higher harmonic wave whose wavelength is in the range of 157 to 158 nm, that is, almost the same as $F_2$ laser light (ultraviolet light) is obtained.

Furthermore, when the oscillation wavelength is in the range of 1.03 to 1.12 um, a seven-time-higher harmonic wave whose wavelength is in the range of 147 to 160 nm is emitted, and, especially, when the oscillation wavelength is in the range of 1.099 to 1.106 um, a seven-time-higher harmonic wave whose wavelength is in the range of 157 to 158 nm, that is, almost the same as $F_2$ laser light (ultraviolet light) is obtained. In this case, for example, an ytterbium-doped fiber laser can be employed as the single wavelength laser.

Moreover, the present invention can be applied not only to an exposure apparatus for producing micro-devices such as semiconductor devices but also to an exposure apparatus that transfers a circuit pattern onto a glass substrate or silicon wafer so as to produce reticles or masks used by a light exposure apparatus, EUV (Extreme Ultraviolet) exposure apparatus, X-ray exposure apparatus, electron beam exposure apparatus, etc. Incidentally, in an exposure apparatus using DUV (far ultraviolet) light or VUV (vacuum ultraviolet) light, a transmissive-type reticle is generally employed. And as the substrate of the reticle, quartz glass, quartz glass with fluorine doped, fluorite, magnesium fluoride, or quartz crystal is employed. And an X-ray exposure apparatus of a proximity type and an electron-beam exposure apparatus employ a transmissive-type mask (stencil-mask, membrane-mask); an EUV exposure apparatus employs a reflective-type mask, and as the substrate of the mask, a silicon wafer or the like is employed.

Note that the present invention can be applied not only to a wafer exposure apparatus used in the production of semiconductor devices but also to an exposure apparatus that transfers a device pattern onto a glass plate in the production of displays such as liquid crystal display devices and plasma displays, an exposure apparatus that transfers a device pattern onto a ceramic plate in the production of thin magnetic heads, and an exposure apparatus used in the production of pick-up devices (CCD, etc.).

In addition, while, in the above embodiment, position detection of alignment marks on a wafer and alignment of the wafer in the exposure apparatus have been described, the method for detecting marks and positions thereof and aligning according to the present invention can be applied to detecting alignment marks on a reticle and positions thereof and aligning the reticle with a wafer, and also to other units than exposure apparatuses such as a unit for observing objects using a microscope, a unit used to detect positions of objects and position them in an assembly line, process line or inspection line and a unit for reading bar-codes attached to objects.

<<A Device Manufacturing Method>>

Next, the manufacture of devices by using the above exposure apparatus and method will be described.

Figure 19:
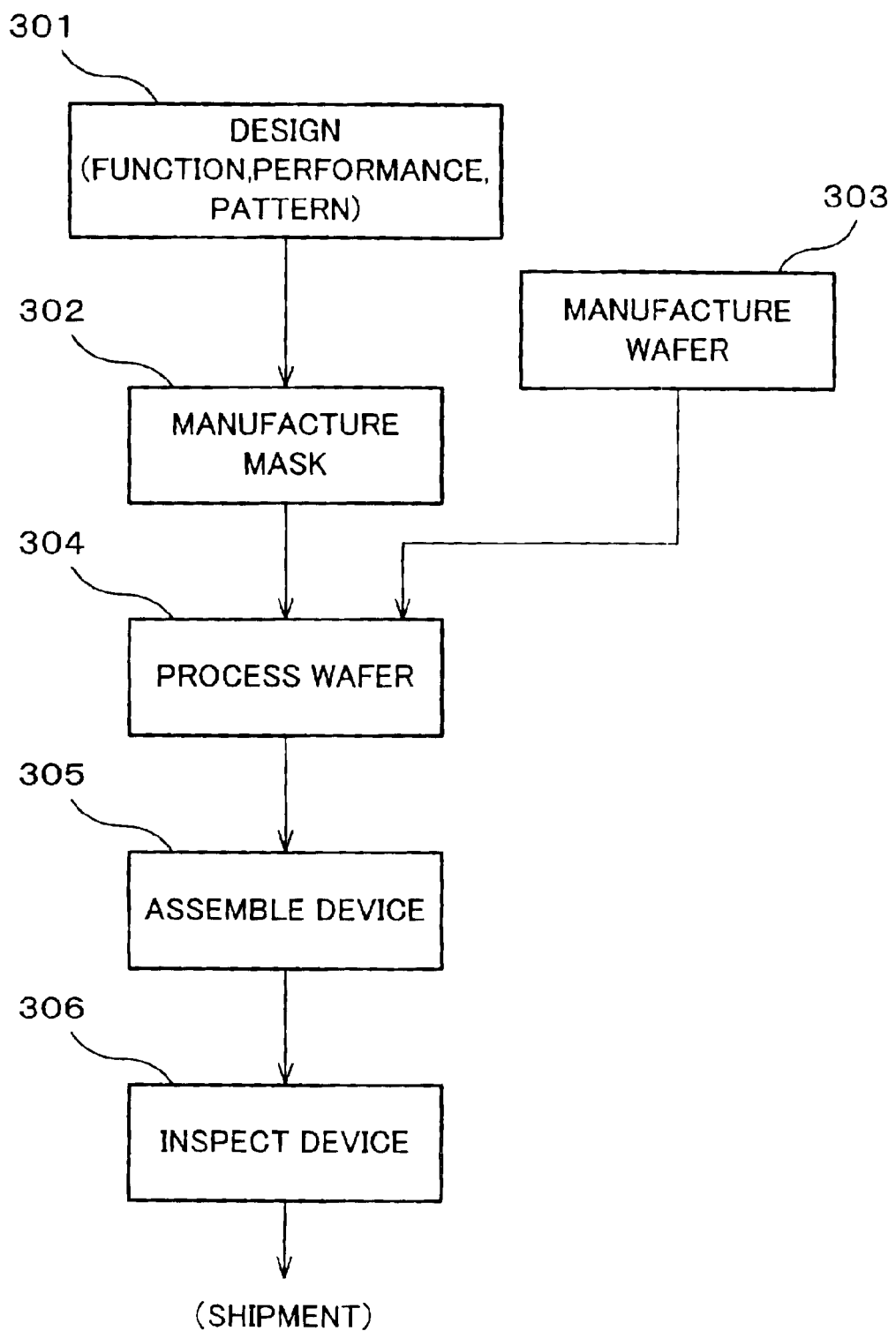
FIG. 19 is a flow chart for explaining the method of manufacturing devices using the exposure apparatus shown in FIG. 1.

FIG. 19 is a flow chart for the manufacture of devices (semiconductor chips such as IC or LSI, liquid crystal panels, CCD's, thin magnetic heads, micro machines, or the like) in this embodiment. As shown in FIG. 19, in step 301 (design step), function/performance design for the devices (e.g., circuit design for semiconductor devices) is performed and pattern design is performed to implement the function. In step 302 (mask manufacturing step), masks on which a different sub-pattern of the designed circuit is formed are produced. In step 303 (wafer manufacturing step), wafers are manufactured by using silicon material or the like.

In step 304 (wafer processing step), actual circuits and the like are formed on the wafers by lithography or the like using the masks and the wafers prepared in steps 301 through 303, as will be described later. In step 305 (device assembly step), the devices are assembled from the wafers processed in step 304. Step 305 includes processes such as dicing, bonding, and packaging (chip encapsulation).

Finally, in step 306 (inspection step), a test on the operation of each of the devices, durability test, and the like are performed. After these steps, the process ends and the devices are shipped out.

Figure 20:
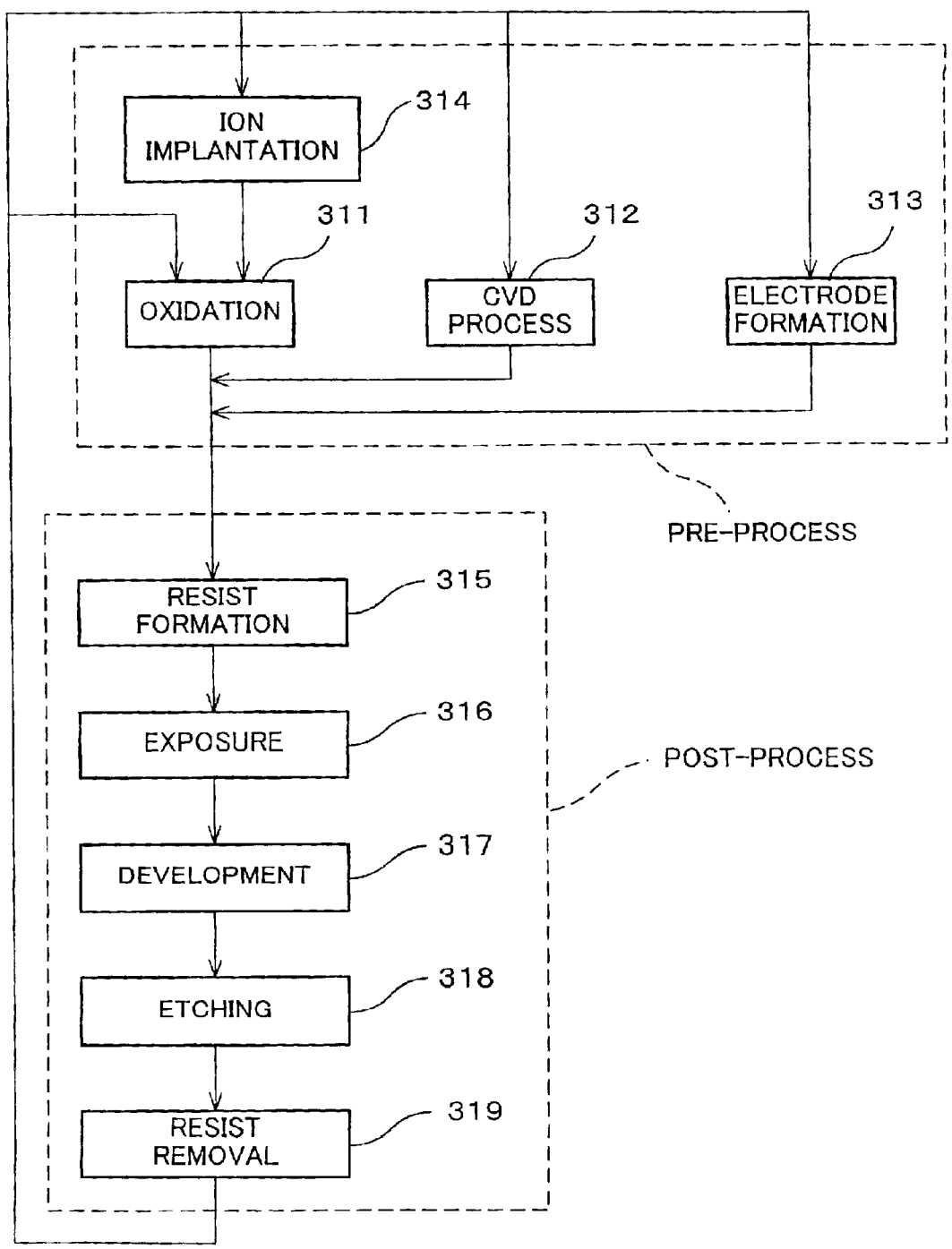
FIG. 20 is a flow chart showing the process in the wafer process step of FIG. 19.

FIG. 20 is a flow chart showing a detailed example of step 304 described above in manufacturing semiconductor devices. Referring to FIG. 20, in step 311 (oxidation step), the surface of a wafer is oxidized. In step 312 (CVD step), an insulating film is formed on the wafer surface. In step 313 (electrode formation step), electrodes are formed on the wafer by vapor deposition. In step 314 (ion implantation step), ions are implanted into the wafer. Steps 311 through 314 described above constitute a pre-process for each step in the wafer process and are selectively executed in accordance with the processing required in each step.

When the above pre-process is completed in each step in the wafer process, a post-process is executed as follows. In this post-process, first of all, in step 315 (resist formation step), the wafer is coated with a photosensitive material (resist). In step 316, the above exposure apparatus transfers a sub-pattern of the circuit on a mask onto the wafer according to the above method. In step 317 (development step), the exposed wafer is developed. In step 318 (etching step), an exposing member on portions other than portions on which the resist is left is removed by etching. In step 319 (resist removing step), the unnecessary resist after the etching is removed.

By repeatedly performing these pre-process and post-process, a multiple-layer circuit pattern is formed on each shot-area of the wafer.

In the above manner, the devices on which a fine pattern is accurately formed are manufactured with high productivity.

Although the embodiments according to the present invention are preferred embodiments, those skilled in the art of lithography systems can readily think of numerous additions, modifications and substitutions to the above embodiments, without departing from the scope and spirit of this invention. It is contemplated that any such additions, modifications and substitutions will fall within the scope of the present invention, which is defined by the claims appended hereto.

What is claimed is:

1. A mark detection method with which to detect a mark formed on an object, comprising:
  measuring a surface state of an area of said object including, in a predetermined direction, a mark-formed area where said mark is formed and a no-mark area formed on the outside in said predetermined direction of said mark-formed area, said no-mark area having a characteristic compared to other areas; and
  extracting, while running a window having a dimension substantially coincident with said no-mark area in a signal process relatively to a signal measured in said measuring and obtaining at least one quantity denoting the surface state of an area in said window moving across said no-mark area having a characteristic based on measurement results through said window in said measuring, an area having a measurement result reflecting said mark based on said at least one quantity varying with position of said window.

2. The mark detection method according to claim 1, further comprising:
  detecting a position of said mark in said predetermined direction based on the measurement result of said area extracted in said extracting.

3. The mark detection method according to claim 1, wherein said surface state includes a state of light from a surface of said object.

4. The mark detection method according to claim 1, wherein said measuring measures a state of a surface of said object, which surface has a plurality of dimensions, and
  wherein said extracting extracts an area having said plurality of dimensions and a measurement result reflecting said mark based on measurement results obtained in said measuring.

5. The mark detection method according to claim 1, wherein said no-mark area consists of two areas on both sides of said mark-formed area along said predetermined direction.

6. The mark detection method according to claim 5, wherein
  in said extracting, while maintaining a relative distance in said predetermined direction between two windows each having a dimension substantially coincident in a signal process with said two areas respectively, said two windows are run in said predetermined direction.

7. The mark detection method according to claim 1, wherein said at least one quantity includes at least one of average and variance of values in a measurement result through said window.

8. The mark detection method according to claim 7, further comprising:
  detecting a position of said mark in said predetermined direction based on the measurement result of said area extracted in said extracting.

9. The mark detection method according to claim 8, wherein said detecting detects a position of said mark in said predetermined direction based on at least one of said average and said variance after removing noise from said measurement result extracted.

10. The mark detection method according to claim 1, wherein said at least one quantity includes at least one of average and variance of integrated values in each of which values in a measurement result through said window are integrated which values are on a respective line perpendicular to said predetermined direction.

11. The mark detection method according to claim 10, further comprising:
  detecting a position of said mark in said predetermined direction based on the measurement result of said area extracted in said extracting.

12. The mark detection method according to claim 11, wherein said detecting detects a position of said mark in said predetermined direction based on at least one of said average and said variance after removing noise from said measurement result extracted.

13. An exposure method with which to transfer a predetermined pattern onto a plurality of divided areas on a substrate as an object, comprising:
  detecting a second number of alignment marks out of a first number of alignment marks, which are formed on said substrate and have substantially the same shape, by a mark detection method according to claim 1 to obtain positions on said substrate of said second number of alignment marks and obtaining positions on said substrate of said divided areas; and transferring said pattern onto said divided areas with aligning said substrate based on positions on said substrate of said divided areas obtained in said detecting.

14. The exposure method according to claim 13, wherein said plurality of divided areas are arranged in a matrix arrangement on said substrate, wherein said alignment marks include a third number of first alignment marks having substantially the same shape, which are used for alignment with respect to a row-direction of said matrix and a fourth number of second alignment marks having substantially the same shape, which are used for alignment with respect to a column-direction of said matrix, and wherein said detecting obtains positions on said substrate and in said row-direction of a fifth number of first alignment marks out of said third number of first alignment marks by said mark detection method and obtains positions on said substrate and in said column-direction of a sixth number of second alignment marks out of said fourth number of second alignment marks by said mark detection method, and then obtains positions on said substrate of said divided areas by performing a statistical process on positions in said row-direction of said fifth number of first alignment marks and positions in said column-direction of said sixth number of second alignment marks.

15. A device manufacturing method including a lithography process, wherein in said lithography process, a predetermined pattern is transferred onto divided areas on a substrate by the exposure method according to claim 14.

16. A mark detection method with which to detect a mark formed on an object, comprising:

measuring a surface state of an area of said object including, in a predetermined direction, a mark-formed area inside which a mark area is formed in said predetermined direction, said mark area having a characteristic compared to other areas; and extracting, while running a window having a dimension substantially coincident with said mark area in a signal process relatively to a signal measured in said measuring and obtaining at least one quantity denoting the surface state of an area in said window moving across said mark area having a characteristic based on measurement results through said window in said measuring, an area having a measurement result reflecting said mark based on said at least one quantity varying with position of said window.

17. The mark detection method according to claim 16, further comprising:

detecting a position of said mark in said predetermined direction based on the measurement result of said area extracted in said extracting.

18. The mark detection method according to claim 16, wherein said surface state includes a state of light from a surface of said object.

19. The mark detection method according to claim 16, wherein said measuring measures a state of a surface of said object, which surface has a plurality of dimensions, and wherein said extracting extracts an area having said plurality of dimensions and a measurement result reflecting said mark based on measurement results obtained in said measuring.

20. The mark detection method according to claim 16, wherein said at least one quantity includes at least one of average and variance of values in a measurement result through said window.

21. The mark detection method according to claim 20, further comprising:

detecting a position of said mark in said predetermined direction based on the measurement result of said area extracted in said extracting.

22. The mark detection method according to claim 21, wherein said detecting detects a position of said mark in said predetermined direction based on at least one of said average and said variance after removing noise from said measurement result extracted.

23. The mark detection method according to claim 16, wherein said at least one quantity includes at least one of average and variance of integrated values in each of which values in a measurement result through said window are integrated which values are on a respective line perpendicular to said predetermined direction.

24. The mark detection method according to claim 23, further comprising:

detecting a position of said mark in said predetermined direction based on the measurement result of said area extracted in said extracting.

25. The mark detection method according to claim 24, wherein said detecting detects a position of said mark in said predetermined direction based on at least one of said average and said variance after removing noise from said measurement result extracted.

26. An exposure method with which to transfer a predetermined pattern onto a plurality of divided areas on a substrate as an object, comprising:

detecting a second number of alignment marks out of a first number of alignment marks, which are formed on said substrate and have substantially the same shape, by a mark detection method according to claim 16 to obtain positions on said substrate of said second number of alignment marks and obtaining positions on said substrate of said divided areas; and transferring said pattern onto said divided areas with aligning said substrate based on positions on said substrate of said divided areas obtained in said detecting.

27. The exposure method according to claim 26, wherein said plurality of divided areas are arranged in a matrix arrangement on said substrate, wherein said alignment marks include a third number of first alignment marks having substantially the same shape, which are used for alignment with respect to a row-direction of said matrix and a fourth number of second alignment marks having substantially the same shape, which are used for alignment with respect to a column-direction of said matrix, and wherein said detecting obtains positions on said substrate and in said row-direction of a fifth number of first alignment marks out of said third number of first alignment marks by said mark detection method and obtains positions on said substrate and in said column-direction of a sixth number of second alignment marks out of said fourth number of second alignment marks by said mark detection method, and then obtains positions on said substrate of said divided areas by performing a statistical process on positions in said row-direction of said fifth number of first alignment marks and positions in said column-direction of said sixth number of second alignment marks.

28. A device manufacturing method including a lithography process, wherein in said lithography process, a predetermined pattern is transferred onto divided areas on a substrate by the exposure method according to claim 27.

29. A mark detection unit which detects a mark formed on an object, comprising:
a measuring unit which measures a surface state of an area of said object including said mark in a predetermined direction; and
an extracting/computing unit which, while running a window having a dimension substantially coincident in a signal process with a specific area on said object having a characteristic different from other areas relatively to a signal measured by said measuring unit and obtaining at least one quantity denoting the surface state of an area in said window moving across said specific area having a characteristic based on measurement results through said window by said measuring unit, extracts an area having a measurement result reflecting said mark based on said at least one quantity varying with position of said window.

30. The mark detection unit according to claim 29, further comprising:
a position-computing unit which obtains a position of said mark in said predetermined direction based on the measurement result of said area extracted by said extracting/computing unit.

31. The mark detection unit according to claim 29, wherein said measuring unit comprises an image-pick-up unit which picks up a mark formed on said object, and wherein said measurement result is light intensities of a mark image picked up by said image-pick-up unit.

32. The mark detection unit according to claim 29, wherein said surface state includes a state of light from a surface of said object.

33. The mark detection unit according to claim 29, wherein said specific area is an area where said mark is formed.

34. An exposure apparatus which transfers a predetermined pattern onto divided areas on a substrate, comprising:
a stage unit which moves said substrate along a movement plane; and
a mark detection unit according to claim 29, which detects alignment marks formed in said divided areas on said substrate mounted on said stage unit.

35. The mark detection unit according to claim 29, wherein said specific area is an area outside a mark-formed area where said mark is formed.

36. The mark detection unit according to claim 35, wherein
said window includes a plurality of windows each having a dimension substantially coincident in a signal process with each of a plurality of said specific areas, said plurality of said specific areas being away from one another, and
said extracting/computing unit runs said plurality of windows, while maintaining a relative positional relation among said plurality of windows.

37. The mark detection unit according to claim 29, wherein said window has a shape corresponding to said specific area having a plurality of dimensions on said object.

38. The mark detection unit according to claim 37, wherein
said window includes a plurality of windows each having a dimension substantially coincident in a signal process with each of a plurality of said specific areas, said plurality of said specific areas being away from one another, and
said extracting/computing unit runs a plurality of windows, while maintaining a relative positional relation among said plurality of windows.

39. A mark detection method with which to detect a mark formed on an object, comprising:
measuring a surface state of an area of said object including said mark in a predetermined direction;
extracting, after obtaining first at least one feature-quantity denoting the surface state of each of partitioned areas of said area based on measurement results obtained in said measuring, a predetermined area having a measurement result reflecting said mark based on said first at least one feature-quantity; and
obtaining a second feature-quantity that is different from said first at least one feature-quantity and that denotes a feature of the surface state of said predetermined area based on said measurement result of said predetermined area extracted in said extracting, and detecting a position of said mark in said predetermined direction based on said second feature-quantity.

40. The mark detection method according to claim 39, wherein said obtaining and detecting obtains as said second feature-quantity a degree to which the surface state of said predetermined area and a template pattern corresponding to said mark are identical.

41. The mark detection method according to claim 39, wherein there is a no-mark area on the outside in said predetermined direction of a mark-formed area where said mark is formed, said no-mark area having a characteristic compared to other areas, and
wherein said extracting runs a window having a dimension corresponding to said no-mark area with defining said plurality of partitioned areas, obtains said first at least one feature-quantity based on measurement results through said window, and extracts said predetermined area based on said first at least one feature-quantity varying with position of said window.

42. The mark detection method according to claim 41, wherein said no-mark area consists of two areas on both sides of said mark-formed area along said predetermined direction.

43. The mark detection method according to claim 41, wherein said first at least one feature-quantity includes at least one of average and variance of values in a measurement result through said window.

44. The mark detection method according to claim 39, wherein there is a mark area on the inside in said predetermined direction of a mark-formed area where said mark is formed, said mark area having a characteristic compared to other areas, and
wherein said extracting runs a window having a dimension corresponding to said mark area with defining said plurality of partitioned areas, obtains said first at least one feature-quantity based on measurement results through said window, and extracts said predetermined area based on said first at least one feature-quantity varying with position of said window.

45. The mark detection method according to claim 44, wherein said first at least one feature-quantity includes at least one of average and variance of values in a measurement result through said window.

46. The mark detection method according to claim 44, wherein said obtaining and detecting obtains as said second feature-quantity a degree to which the surface state of said predetermined area and a template pattern corresponding to said mark are identical.

47. An exposure method with which to transfer a predetermined pattern onto a plurality of divided areas on a substrate as an object, comprising:
detecting a second number of alignment marks out of a first number of alignment marks, which are formed on said substrate and have substantially the same shape, by a mark detection method according to claim 39 to obtain positions on said substrate of said second number of alignment marks and obtaining positions on said substrate of said divided areas; and transferring said pattern onto said divided areas with aligning said substrate based on positions on said substrate of said divided areas obtained in said detecting.

48. The exposure method according to claim 47, wherein said plurality of divided areas are arranged in a matrix arrangement on said substrate, wherein said alignment marks include a third number of first alignment marks having substantially the same shape, which are used for alignment with respect to a row-direction of said matrix and a fourth number of second alignment marks having substantially the same shape, which are used for alignment with respect to a column-direction of said matrix, and wherein said detecting obtains positions on said substrate and in said row-direction of a fifth number of first alignment marks out of said third number of first alignment marks by said mark detection method and obtains positions on said substrate and in said column-direction of a sixth number of second alignment marks out of said fourth number of second alignment marks by said mark detection method, and then obtains positions on said substrate of said divided areas by performing a statistical process on positions in said row-direction of said fifth number of first alignment marks and positions in said column-direction of said sixth number of second alignment marks.

49. A device manufacturing method including a lithography process, wherein in said lithography process, a predetermined pattern is transferred onto divided areas on a substrate by the exposure method according to claim 48.

50. A mark detection unit which detects a mark formed on an object, comprising:

a measuring unit which measures a surface state of an area of said object including said mark in a predetermined direction;

an extracting/computing unit which, after obtaining first at least one feature-quantity denoting the surface state of each of partitioned areas of said area based on measurement results obtained by said measuring unit, extracts a predetermined area having a measurement result reflecting said mark based on said first at least one feature-quantity; and a position computing unit which obtains a second feature-quantity that is different from said first at least one feature-quantity and that denotes a feature of the surface state of said predetermined area based on said measurement result of said predetermined area extracted by said extracting/computing unit, and detects a position of said mark in said predetermined direction based on said second feature-quantity.

51. The mark detection unit according to claim 50, wherein said position computing unit has a template pattern corresponding to said mark, and wherein said second feature-quantity includes a degree to which the surface state of said predetermined area and said template pattern are identical.

52. An exposure apparatus which transfers a predetermined pattern onto divided areas on a substrate, comprising:

a stage unit which moves said substrate along a movement plane; and a mark detection unit according to claim 50, which detects alignment marks formed in said divided areas on said substrate mounted on said stage unit.

53. The mark detection unit according to claim 50, wherein said extracting/computing unit, while running a window having a dimension corresponding to a specific area on said object having a characteristic different from other areas and obtaining said first at least one feature-quantity based on measurement results through said window, extracts said predetermined area based on said first at least one feature-quantity varying with position of said window.

54. The mark detection unit according to claim 53, wherein said window has a dimension corresponding to a no-mark area on the outside in said predetermined direction of a mark-formed area where said mark is formed, said no-mark area having a characteristic compared to other areas.

55. The mark detection unit according to claim 53, wherein said window has a dimension corresponding to a mark area on the inside in said predetermined direction of a mark-formed area where said mark is formed, said mark area having a characteristic compared to other areas.

56. The mark detection unit according to claim 53, wherein said first at least one feature-quantity includes at least one of average and variance of values in a measurement result through said window.

* * * * *